(12) United States Patent
Ohido et al.

(10) Patent No.: US 7,517,406 B2
(45) Date of Patent: Apr. 14, 2009

(54) MAGNETIC GARNET MATERIAL, FARADAY ROTATOR, OPTICAL DEVICE, BISMUTH-SUBSTITUTED RARE EARTH-IRON-GARNET SINGLE-CRYSTAL FILM AND METHOD FOR PRODUCING THE SAME AND CRUCIBLE FOR PRODUCING THE SAME

(75) Inventors: Atsushi Ohido, Tokyo (JP); Tamotsu Sugawara, Tokyo (JP); Kazuhito Yamasawa, Tokyo (JP); Shinichiro Kakei, Tokyo (JP); Kazuya Shimakawa, Tokyo (JP); Katsunori Hosoya, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 12/003,345

(22) Filed: Dec. 21, 2007

(65) Prior Publication Data

US 2008/0112046 A1 May 15, 2008

Related U.S. Application Data

(62) Division of application No. 11/399,398, filed on Apr. 7, 2006, now Pat. No. 7,333,261, which is a division of application No. 10/366,341, filed on Feb. 14, 2003, now Pat. No. 7,133,189.

(30) Foreign Application Priority Data

| Feb. 22, 2002 | (JP) | ............................ 2002-046552 |
| Jun. 28, 2002 | (JP) | ............................ 2002-191494 |
| Jul. 5, 2002 | (JP) | ............................ 2002-197742 |
| Dec. 9, 2002 | (JP) | ............................ 2002-356529 |
| Dec. 13, 2002 | (JP) | ............................ 2002-362021 |

(51) Int. Cl.
*C30B 11/04* (2006.01)

(52) U.S. Cl. .............................. 117/11; 117/54; 117/56; 117/89; 117/105

(58) Field of Classification Search ................... 117/11, 117/54, 56, 89, 105
See application file for complete search history.

(56) References Cited

U.S. PATENT DOCUMENTS

| 3,947,372 A | 3/1976 | Shinagawa et al. |
| 4,077,832 A | 3/1978 | Robertson et al. |
| 4,222,668 A | 9/1980 | Henry |
| 4,578,651 A | 3/1986 | Heitmann et al. |
| 4,625,390 A | 12/1986 | Shone et al. |
| 4,671,621 A | 6/1987 | Dillon et al. |
| 4,690,726 A | 9/1987 | Luther et al. |

(Continued)

FOREIGN PATENT DOCUMENTS

JP        B2-045719        3/1982

(Continued)

*Primary Examiner*—Felisa C Hiteshew
(74) *Attorney, Agent, or Firm*—Oliff & Berridge, Plc

(57) ABSTRACT

Proposed is a technique of producing a magnetic garnet material of which the light absorption characteristics worsen little even though it is produced through LPE. The crucible for LPE is formed of a material containing Au. The amount of Au to be taken in single crystal formed in an Au crucible is smaller than that of Pt to be taken therein formed in a Pt crucible. As compared with Pt, the influence of Au on magnetic garnet film that increases the insertion loss in the film is small.

3 Claims, 16 Drawing Sheets

U.S. PATENT DOCUMENTS

| | | |
|---|---|---|
| 4,728,178 A | 3/1988 | Gualtieri et al. |
| 4,778,580 A | 10/1988 | Doormann et al. |
| 5,434,101 A | 7/1995 | Yamasawa et al. |
| 5,479,290 A | 12/1995 | Tanno et al. |
| 5,662,740 A | 9/1997 | Yamasawa et al. |
| 5,920,420 A | 7/1999 | Ishikura et al. |
| 6,309,557 B1 | 10/2001 | Ooido et al. |
| 6,483,645 B1 | 11/2002 | Tanno et al. |
| 6,641,751 B1 | 11/2003 | Ooido et al. |
| 2002/0014612 A1 | 2/2002 | Ohido et al. |

FOREIGN PATENT DOCUMENTS

| | | |
|---|---|---|
| JP | A-61-20306 | 1/1986 |
| JP | 04-132697 A | 5/1992 |
| JP | 04-139094 A | 5/1992 |
| JP | B2 6-46604 | 6/1994 |
| JP | A 9-175898 | 7/1997 |
| JP | A 9-185027 | 7/1997 |
| JP | 09-202697 A | 8/1997 |
| JP | A 11-322496 | 11/1999 |

FORWARD DIRECTION →

MAGNETIC GARNET MATERIAL, FARADAY ROTATOR, OPTICAL DEVICE, BISMUTH-SUBSTITUTED RARE EARTH-IRON-GARNET SINGLE-CRYSTAL FILM AND METHOD FOR PRODUCING THE SAME AND CRUCIBLE FOR PRODUCING THE SAME

This is a Division of application Ser. No. 11/399,398 filed Apr. 7, 2005, which in turn is a division of application Ser. No. 10/366,341 filed Feb. 14, 2003. The entire disclosure of the prior applications is hereby incorporated by reference herein in their entireties.

BACKGROUND OF THE INVENTION

1. Field of the Invention

The present invention relates to a magnetic garnet material for use in optical communication systems, a Faraday rotator, an optical device, a bismuth-substituted rare earth-iron-garnet single-crystal film and a method for producing the same and a crucible for producing the same, especially to a technique for obtaining a Faraday rotator that has the advantages of reduced insertion loss and improved magnetic properties.

2. Description of the Related Art

Optical communication is now being much popularized instead of electric communication of small transmission capacity. The reason is essentially because optical communication enables high-speed large-capacity transmission, it is favorable for long-distance transmission not requiring too many relays, and it is not influenced by electromagnetic noise, as will be described hereinunder.

Light falls in the same concept as that of radio waves used in TV and radio broadcasting and in radio communication, in that they are electromagnetic waves. However, the number of frequency of electromagnetic waves that are used in optical communication is about 200 THz and is about 20000 times that of radio waves (about 10 GHz) used in satellite broadcasting. The higher frequency means shorter wavelength, and enables high-speed transmission of more signals. The wavelength (center wavelength) of electromagnetic waves that are used in optical communication is 1.31 µm and 1.55 µm.

As well known, optical fibers that are used in optical communication have a two-layered structure of glass in which the refractive index of one layer differs from that of the other layer. The light that runs through the center core of such optical fibers is repeatedly reflected inside the core, and therefore optical fibers can accurately transmit signals through them even though they are bent. In addition, since high-purity quartz glass of high transparency is used for optical fibers, the data attenuation in optical communication through them is only about 0.2 dB per km. Accordingly, optical fibers enable data transmission even to a distance of about 100 km with no amplifier therein, and as compared with that in electric communication, the number of relays in optical communication may be reduced.

Electric communication shall face a problem of EMI (electromagnetic interference), but optical communication through optical fibers is not influenced by electromagnetic induction noise. Therefore, optical communication enables information transmission of extremely high quality.

In current optical communication systems, electric signals are converted into optical signals by LD (laser diode) in light transmitter. The optical signals are transmitted by optical fibers and then converted into electric signals by PD (photodiode) in light receiver. In that manner, the indispensable elements in optical communication systems are LD, PD, optical fibers and optical connectors. Apart from relatively low-speed short-distance communication systems, high-speed long-distance communication systems require optical transmission devices such as optical amplifier and optical divider, and also other optical devices to be combined with them, such as optical isolator, optical coupler, optical branching filter, optical switch, optical modulator and optical attenuator, in addition to the elements mentioned above.

In high-speed long-distance transmission or multi-branch optical communication systems, the element that is especially important is optical isolator. In current optical communication systems, optical isolators are used in LD modules of optical transmitters and in relays. The role of optical isolator is to transmit light only in one direction and to interrupt the light that has reflected in its running course to turn back. Faraday effect, a type of magneto-optical effect is applied to optical isolator. Faraday effect indicates a phenomenon of such that the plane of polarization of light is rotated after having passed through a transparent medium that is in a magnetic field applied thereto. The phenomenon of light of which the plane of polarization is rotated is referred to as rotary polarization. Magneto-optical rotation (Faraday rotation) to be caused by Faraday effect differs from ordinary optical rotation (natural optical rotation) in that, even when the light traveling direction is reversed, its rotary direction does not still change. An optical element that takes advantage of the phenomenon of rotary polarization owing to Faraday effect is referred to as a Faraday rotator.

Faraday rotator has some influence on the performance of optical isolator that comprises it. Accordingly, the properties of the materials to constitute Faraday rotators are important for obtaining optical isolators of high performance. The matters of importance in selecting the materials to constitute Faraday rotators are that the selected materials enable a large Faraday rotation angle at the wavelength of light for service (1.31 µm and 1.55 µm for optical fibers) and their transparency is high. At first, YIG (yttrium-iron-garnet; $Y_3Fe_5O_{12}$) was used for the material that satisfies the requirements. However, the problems with YIG are that its mass-scale productivity is low and its size reduction is difficult. Meanwhile it has been found that, when the rare earth site of garnet-type crystals is substituted with Bi (bismuth), then the Faraday rotation performance of the resulting crystals is drastically improved. After that, Bi-substituted rare earth-iron-garnet single-crystal film (herein after this will be simply referred to as "garnet single-crystal film") has been used for Faraday rotators.

Bi-substituted rare earth-iron-garnet single-crystal film is formed in a mode of liquid phase epitaxial growth (LPE). In a process of LPE, bismuth oxide, and rare earth, iron and garnet oxides (starting components) that include, for example, ferric oxide and rare earth oxides are formed into a starting material composition along with a flux component that contains lead oxide and boron oxide, and this is put into a Pt crucible. Next, the crucible is heated at a predetermined temperature in which the starting components are thereby melted into a melt. Next, the melt is cooled to be in a supercooled condition, and it is contacted with an LPE substrate while the substrate is rotated, whereby the intended garnet single-crystal film epitaxially grows on the LPE substrate.

One problem which has heretofore been pointed out with the LPE process of forming such a garnet single-crystal film is that the crucible used is corroded. It is well known that Pt is highly resistant to corrosion, but its corrosion resistance to lead oxide that forms the flux component and to the bismuth oxide-containing melt is unsatisfactory. Accordingly, even Pt crucibles are significantly corroded at the area around the face of the melt therein when the level of the melt is kept constant.

For preventing crucibles from being corroded by the melt therein, JP-A 9-175898 (herein after referred to as "Reference 1") describes a method of moving the level of the melt in a crucible to thereby move the region of the crucible that may be corroded by the melt, and this is for controlling the amount of dissolution of crucibles. JP-A 11-322496 (herein after referred to as "Reference 2") describes a method of providing, inside a Pt crucible, a Pt corrosion inhibitor separable from the Pt crucible. The methods described in Reference 1 and Reference 2 will be good since they are effective for reducing the frequency of exchanging or recasting Pt crucibles.

However, the methods described in Reference 1 and Reference 2 could not still reduce the amount of Pt to be released from corroded crucibles to contaminate the melt in the crucibles. Pt taken in the garnet single-crystal film increases the light absorption of the film. This is because the element Pt to be a tetravalent cation is taken in the garnet single-crystal film and the film therefore loses its charge balance, and the light absorption characteristics of the film are thereby worsened.

For preventing the light absorption characteristics of such garnet single-crystal film from being worsened, some methods have heretofore been investigated. For example, the film is subjected to suitable heat treatment, or a suitable amount of an element to be a divalent cation (e.g., Ca) or an element to be a tetravalent cation (e.g., Ge) is added thereto so as to keep the charge balance of the film. However, even the heat treatment or the addition of the element to be a divalent or tetravalent cation could not always satisfactorily restore the light absorption characteristics of the film.

SUMMARY OF THE INVENTION

An object of the present invention is to provide a magnetic garnet material capable of realizing reduced insertion loss and improved magnetic characteristics, a Faraday rotator, an optical device, a bismuth-substituted rare earth-iron-garnet single-crystal film and a method for producing it and a crucible for its production.

While a Bi-substituted rare earth-iron-garnet single-crystal film is grown in a Pt crucible, Pt that constitutes the crucible gradually dissolves in the flux in the crucible. In addition, Pt is substituted with Fe in the garnet single crystal and is thereby taken in the crystal. In this connection, we, the present inventors have reached the following knowledge. The amount of Pt that dissolves in the flux and is thereby taken in the garnet single crystal increases in the direction in which the garnet single-crystal film grows, and the amount of Pt to be taken in the garnet single crystal gradually increases owing to the temperature change in the process of the growth of the garnet single-crystal film.

As in the above, the amount of Pt gradually increases in the process of the growth of the garnet single-crystal film. In other words, the amount of Pt varies in the direction of the thickness of the garnet single-crystal film. Accordingly, even when a part of the garnet single-crystal film could have a charge balance, the other part thereof could not. Namely, the garnet single-crystal film still loses its charge balance as a whole. When light is applied to the garnet single-crystal film in that condition, the film absorbs the light. Therefore, the light insertion loss in the Faraday rotator formed of the garnet single-crystal film is great.

Given that situation, we, the present inventors have specifically noted that metal elements to be trivalent cations would be hardly taken in Bi-substituted rare earth-iron garnet single crystals and, even if taken in the crystals, the elements would not break the charge balance of garnet single-crystal films. Accordingly, the invention provides a magnetic garnet material formed of a bismuth-substituted rare earth-iron-garnet single-crystal film, for which the chemical composition of the single-crystal film is represented by:

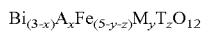

$$Bi_{(3-x)}A_xFe_{(5-y-z)}M_yT_zO_{12}$$

wherein A is one or more selected from a group of rare earth elements including Y, and Ca; M is one or more selected from a group of Ga, Al, Ge, Sc, In, Si, Ti, Mg, Mn and Zr; T is one or more selected from a group of Au, Rh and Ir; $0.2 \leq x \leq 2.5$, $0 \leq y \leq 2.0$, and $0 < z \leq 0.1$.

The magnetic garnet material of the invention is characterized in that the concentration distribution of the element T is almost uniform in the direction of the thickness of the single-crystal film. This characteristic of the material is contrastive to the fact that the Pt concentration distribution in garnet single-crystal film formed in Pt crucibles is proportional to the distance extending in the direction of the thickness of the film.

Magnetic garnet material includes two types of soft magnetism and hard magnetism, and the former loses its Faraday effect when the external magnetic field around it is removed, while the latter still keeps its Faraday effect even when the external magnetic field around it is removed. Optical isolator that contains a Faraday rotator formed of a soft magnetic garnet material needs a permanent magnet for imparting an external magnetic field to the Faraday rotator. Contrary to this, a permanent magnet may be omitted in optical isolator that contains a Faraday rotator formed of a hard magnetic garnet material. Permanent magnet omission may reduce the size and the cost of optical isolators and even other various appliances and structures that take advantage of Faraday effect. For these reasons, Bi-substituted rare earth-iron-garnet single-crystal films of hard magnetism are developed. The present invention may apply to both types of magnetic garnet material of soft magnetism and hard magnetism.

We, the present inventors have found that Pt concentration distribution, if any, in magnetic garnet material has some negative influence on the hard magnetism of the material. Though its reason will be described in detail hereinunder, a Faraday rotator formed of a Bi-substituted rare earth-iron-garnet single-crystal film in which the Pt concentration increased from the initial stage to the latter stage of the film growth has two Faraday rotation angles at around the compensation temperature thereof. In this description, the phenomenon of multiple Faraday rotation angles appearing separated from each other is referred to as "split". Of the hard magnetic Faraday rotator with such a split, the coercive force is lowered. The compensation temperature of hard magnetic garnet single-crystal film falls within the service temperature range of the Faraday rotator formed of the film (generally from −40 to 85° C.), and it is desirable that the split is prevented from occurring at around the compensation temperature. As well known by anyone skilled in the art, the compensation temperature of the film is a temperature at which the overall magnetic moment of the rare earth element ions is the same as that of the Fe ions in the film and therefore the apparent magnetization of the film is 0 (zero). However, as shown in the Examples given hereinunder, the spontaneous magnetization of some actually produced hard magnetic garnet materials could be the lowermost value at around room temperature, but could not be 0. In this description, the temperature at which the spontaneous magnetization is the lowermost value may also be referred to as a compensation temperature for convenience sake.

Contrary to it, the hard magnetic garnet material of the invention mentioned above may evade split occurrence at around the compensation temperature thereof.

Of the elements for T mentioned above, Au is most preferred in the invention. Accordingly, the invention provides a Faraday rotator formed of an Au-containing bismuth-substituted rare earth-iron-garnet single-crystal film, which has the ability to rotate the plane of polarization of the incident light thereon and in which the insertion loss is 0.03 dB or less. Preferably, the amount of Au in the single-crystal film is 0.01 or less (not including 0) in terms of the molar ratio thereof.

The single-crystal film that forms the Faraday rotator of the invention allows the presence of Pt therein. This is because Pt does not have any negative influence on the insertion loss so far as the amount of Pt in the single-crystal film is limited to 0.01 or less in terms of the molar ratio thereof.

The invention also provides an optical device that comprises the above-mentioned Faraday rotator. The optical device comprises a first optical element inputs forward incident light thereon, a second optical element that is disposed opposite to the first optical element via a predetermined distance there between and transmits the forward light, and a Faraday rotator that is disposed between the first optical element and the second optical element so as to rotate the plane of polarization of the light having passed through the first optical element and to transmit it toward the second optical element; in which the Faraday rotator is formed of an Au-containing bismuth-substituted rare earth-iron-garnet single-crystal film, and has the ability to rotate the plane of polarization of the incident light thereon, and its insertion loss is 0.03 dB or less.

The invention also provides a method for obtaining the Au-containing bismuth-substituted rare earth-iron-garnet single-crystal film of the invention. The method is grouped into a first method and a second method. The first method is essentially characterized in that the crucible to be used in forming the garnet single-crystal film through LPE comprises Au. The second method is essentially characterized in that the starting material to form the garnet single-crystal film contains Au.

The first method is for producing a bismuth-substituted rare earth-iron-garnet single-crystal film in a mode of liquid-phase epitaxial growth, and this comprises a step of putting a starting material composition for the bismuth-substituted rare earth-iron-garnet single-crystal film and a flux composition into a crucible that contains Au at least in the site thereof to be kept in contact with a melt therein, a step of heating and melting the starting material composition to be a melt, a step of cooling the melt to a temperature at which the bismuth-substituted rare earth-iron-garnet single-crystal film grows, and a step of contacting the thus-cooled melt with a single-crystal film-growing substrate to thereby make the intended bismuth-substituted rare earth-iron-garnet single-crystal film grow on the substrate.

The second method is for producing a bismuth-substituted rare earth-iron-garnet single-crystal film in a mode of liquid-phase epitaxial growth, and this comprises a step of putting a starting material composition for the bismuth-substituted rare earth-iron-garnet single-crystal film, Au and a flux composition into a crucible, a step of heating and melting the starting material composition and Au to be a melt, a step of cooling the melt to a temperature at which the bismuth-substituted rare earth-iron-garnet single-crystal film grows, and a step of contacting the thus-cooled melt with a single-crystal film-growing substrate to thereby make the intended bismuth-substituted rare earth-iron-garnet single-crystal film grow on the substrate.

The invention also provides the crucible to be used in the first method. The crucible is used in producing the bismuth-substituted rare earth-iron-garnet single-crystal film in a mode of liquid-phase epitaxial growth, and at least its region that is kept in contact with the melt is formed of Au or Au alloy.

DESCRIPTION OF THE PREFERRED EMBODIMENTS

First Embodiment of the Invention

Figure 1:
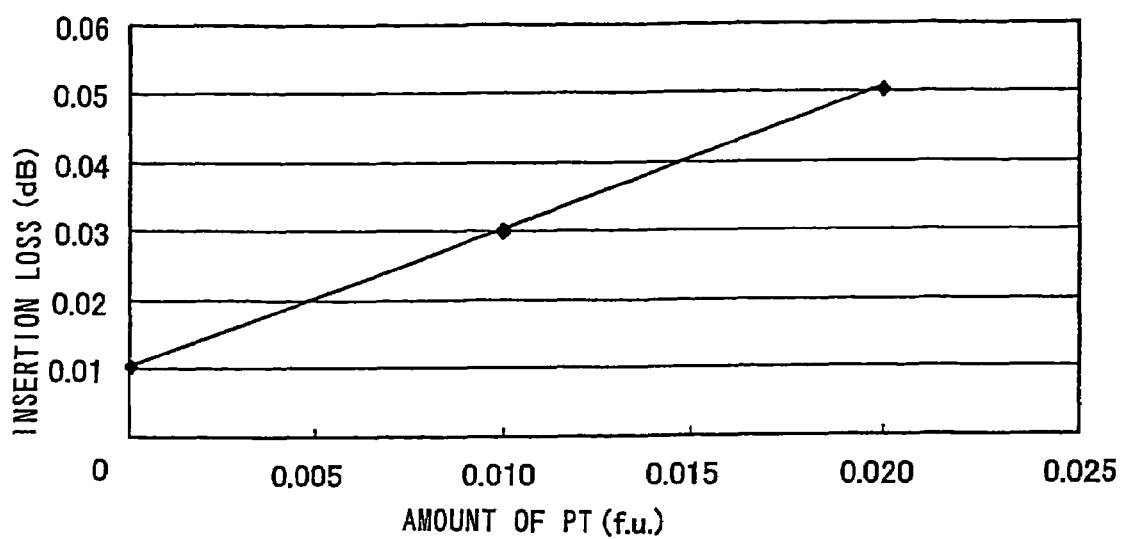
FIG. 1 is a graph showing the relationship between the amount of Pt and insertion loss.

The magnetic garnet material, the Faraday rotator, the method for producing a bismuth-substituted rare earth-iron-garnet single-crystal film, and the crucible for the method of the first embodiment of the invention are described with reference to FIG. 1 to FIG. 10. The magnetic garnet material of this embodiment has a chemical composition of:

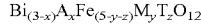

$Bi_{(3-x)}A_xFe_{(5-y-z)}M_yT_zO_{12}$ wherein A is one or more selected from a group of rare earth elements including Y, and Ca; M is one or more selected from a group of Ga, Al, Ge, Sc, In, Si, Ti, Mg, Mn and Zr; T is one or more selected from a group of Au, Rh and Ir; $0.2 \leq x \leq 2.5$, $0 \leq y \leq 2.0$, and $0 < z \leq 0.1$.

The composition shows only the elements that are intended to be in the material. For example, it does not show Pb that is to be in the material from the flux used in growing the single-crystal film through LPE, but this embodiment does not deny the presence of any inevitable element in the material.

The most characteristic indispensable element in the magnetic garnet material of this embodiment is the element T. However, the element T is expensive and, even if too much in the material, its effect does not increase in accordance with its increased amount. Therefore, the uppermost limit of the amount of the element T indicated by z is 0.1. Preferably, the uppermost limit of z is 0.05, more preferably 0.01. The element T is a metal element to be a trivalent cation, and its valence is the same as that of the cations constituting the Bi-substituted rate earth-iron-garnet single-crystal film for the material. Accordingly, this does not break the charge balance of the garnet single-crystal film, dislike Pt, an element that is stable when it is a tetravalent cation. The metal element to be a trivalent cation includes Au, Rh and Ir, any of which is expected to attain the above-mentioned effect in view of the valence of their cations. However, Au is the most desirable for use herein. As will be described in detail hereinunder, the reason is because Au is suitable for the material of crucibles for LPE.

In the Bi-substituted rare earth-iron-garnet material of this embodiment, the element A is one or more selected from a group of rare earth elements including Y (Y, Gd, Tb, Yb, Sm, Eu, Dy, Lu, Tm, Er, Ho, La, Ce, Pr, Nd), and Ca. x that indicates the amount of the element A satisfies $0.2 \leq x \leq 2.5$. If x is smaller than 0.2, the amount of Bi of which the ionic radius is large relatively increases, and if so, the garnet single-crystal film growing through LPE on an LPE substrate could not match with the substrate in point of the lattice constant. Contrary to this, if x is larger than 2.5, the amount of Bi relatively decreases, and if so, the Faraday rotation performance of the film material will be low. As a result, the thickness of the garnet single-crystal film must be increased, but such thick garnet single-crystal film is difficult to form through LPE and the productivity of the film lowers. Preferably, $1.0 \leq x \leq 2.3$, more preferably $1.3 \leq x \leq 2.0$.

For the rare earth elements, preferably selected are three elements of Gd, Tb and Yb. Of the rare earth elements, Gd has the largest magnetic moment and it is therefore effective for reducing the saturation magnetization (4 πMs) of the garnet material. The magnetization reversal temperature of GdBi-type garnet is around −10° C. and is nearer to room temperature than the magnetization reversal temperature (−50° C.) of TbBi-type garnet, and therefore the former GdBi-type garnet is more advantageous for obtaining hard magnetic garnet single-crystal film. In addition, since Gd does not absorb light having a wavelength of 1.2 μm or more, it is effective for reducing insertion loss.

Tb is an element effective for ensuring temperature characteristics and wavelength characteristics. Gd has a high degree of magnetic anisotropy and is effective for increasing coercive force. However, Tb is superior to Gd in point of the ability to increase coercive force.

Yb is incorporated into the material for making the lattice constant of the garnet single-crystal film match with that of the LPE substrate. This embodiment is based on the premise that the garnet single-crystal film is formed through LPE. For increasing the Faraday rotation performance thereof, crystal with more Bi is desired for the film. The LPE substrate has a predetermined lattice constant. Bi has a large ionic radius. Therefore, if the amount of Bi is merely increased, the lattice constant of the intended garnet single-crystal film could not match with that of the LPE substrate. Therefore, with the amount of Bi to be in the material being increased, Yb that has a small ionic radius is added to the material so as to make the lattice constant of the intended garnet single-crystal film well match with that of the LPE substrate. Yb does not absorb light that is used in optical communication, and therefore does not increase insertion loss.

Sm, Eu and Dy all have a high degree of magnetic anisotropy, like Gd and Tb. Lu, Tm, Er, Ho and Y are similar to Yb in that their ionic radii are all small.

In the Bi-substituted rare earth-iron-garnet material of this embodiment, M is an element to substitute for a part of Fe, and it is one or more selected from a group of Ga, Al, Ge, Sc, In, Si, Ti, Mg, Mn and Zr. Of those, Ga is the most desirable element in view of easy growth of the garnet single-crystal film containing it. y that indicates the degree of substitution of Fe with M satisfies $0 \leq y \leq 2.0$. However, for hard magnetic materials, or that is, for those showing a square magnetic hysteresis, y is preferably at least 0.1. On the other hand, if y is more than 2.0, unnecessary nuclei form in the melt to give the intended garnet single-crystal film and, if so, the garnet single-crystal film could not well grow. The preferred range of y for obtaining hard magnetic garnet single-crystal film is $0.3 \leq y \leq 1.7$, more preferably $0.4 \leq y \leq 1.5$.

FIG. 1 shows the relationship between the amount of Pt in the Bi-substituted rare earth-iron-garnet single crystal film and the insertion loss in the Faraday rotator formed of the film. In this, the horizontal axis indicates the amount of Pt (f.u.); and the vertical axis indicates the insertion loss (dB). As in FIG. 1, when the amount of Pt is 0.01 or so, the insertion loss in the Faraday rotator may be controlled to 0.03 db or so. On the other hand, when the amount of Pt is 0, then the insertion loss in the Faraday rotator may be controlled to 0.01 dB or so. This suggests that the amount of Pt in the magnetic garnet material of this embodiment is most preferably 0 but a minor amount of Pt may be in the material. However, since Pt is readily taken in garnet single-crystal film while the film grows, and if Pt crucibles are used in the film formation, it is difficult to reduce the amount of Pt in the formed film to less than 0.01.

Figure 2:
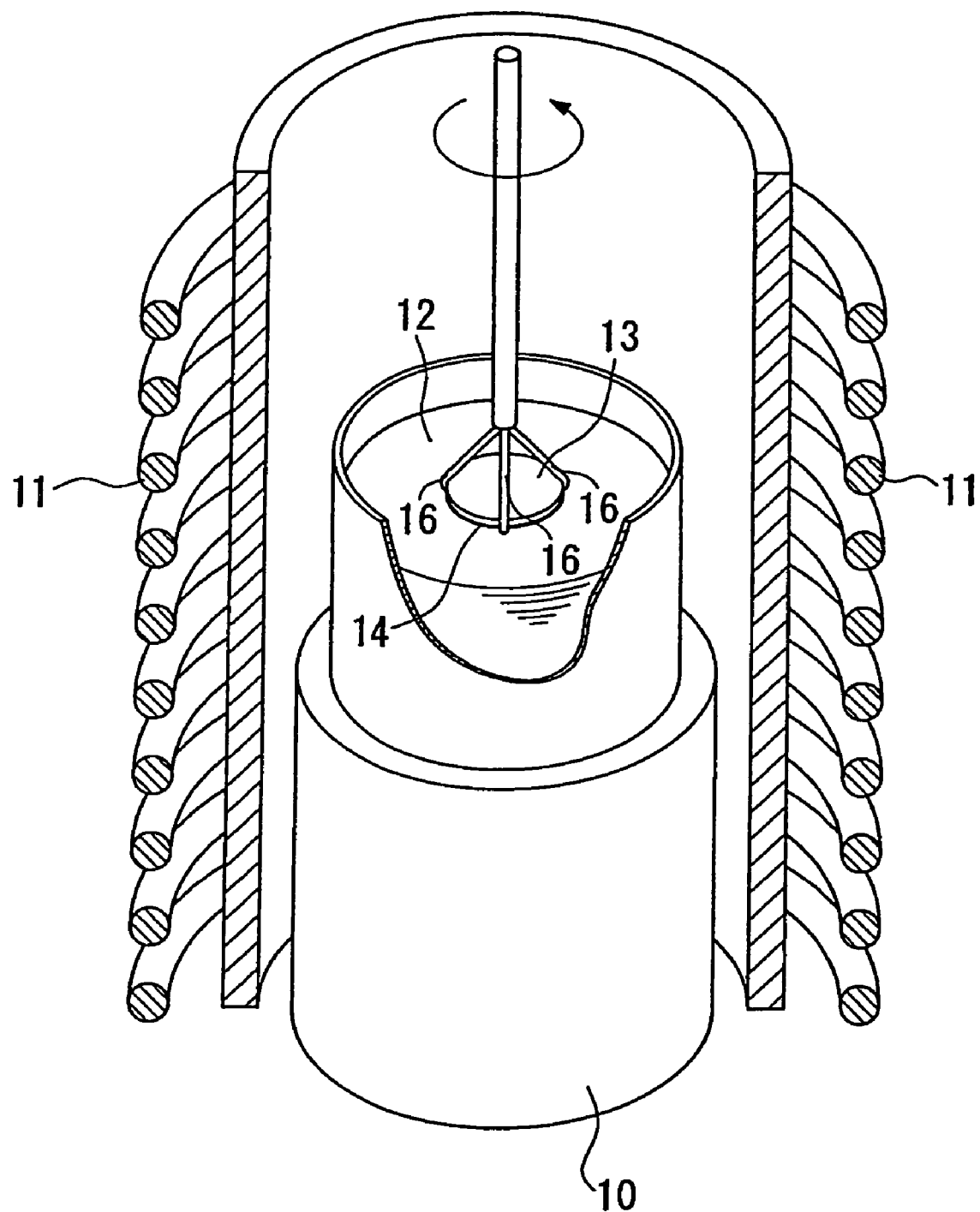
FIG. 2 is a view for explaining a process of LPE.

The magnetic garnet material of this embodiment may be produced through LPE. FIG. 2 is a view showing a way of growing a garnet single-crystal film through LPE. As in FIG. 2, oxides of rare earth-iron-garnet components (starting material composition) and a flux composition are put into a crucible 10. The oxides of rare earth-iron-garnet components include ferric oxide, rare earth oxide and bismuth oxide. The flux composition contains lead oxide and boron oxide. However, these are examples, and may contain any other oxides and flux components depending on the chemical composition of the garnet single-crystal film to be obtained herein. The elements of constituting the flux component may be taken in the garnet single-crystal film while the film grows. For example, when lead oxide is used as one flux component, the grown garnet single-crystal film may contain a minor amount of Pb.

This embodiment is characterized in that the crucible 10 used contains Au in at least the site at which the melt 12 is kept in contact with the crucible 10. The terminology "containing Au" as referred to herein includes a case where the crucible 10 is entirely formed of Au and also a case where a part of the crucible 10, for example, only the inner wall of the crucible 10 is formed of Au. In addition, this concept includes not only pure Au but also Au alloys for use in the crucible. The element that may be alloyed with Au includes Ir, Rh, Pt.

Figure 3:
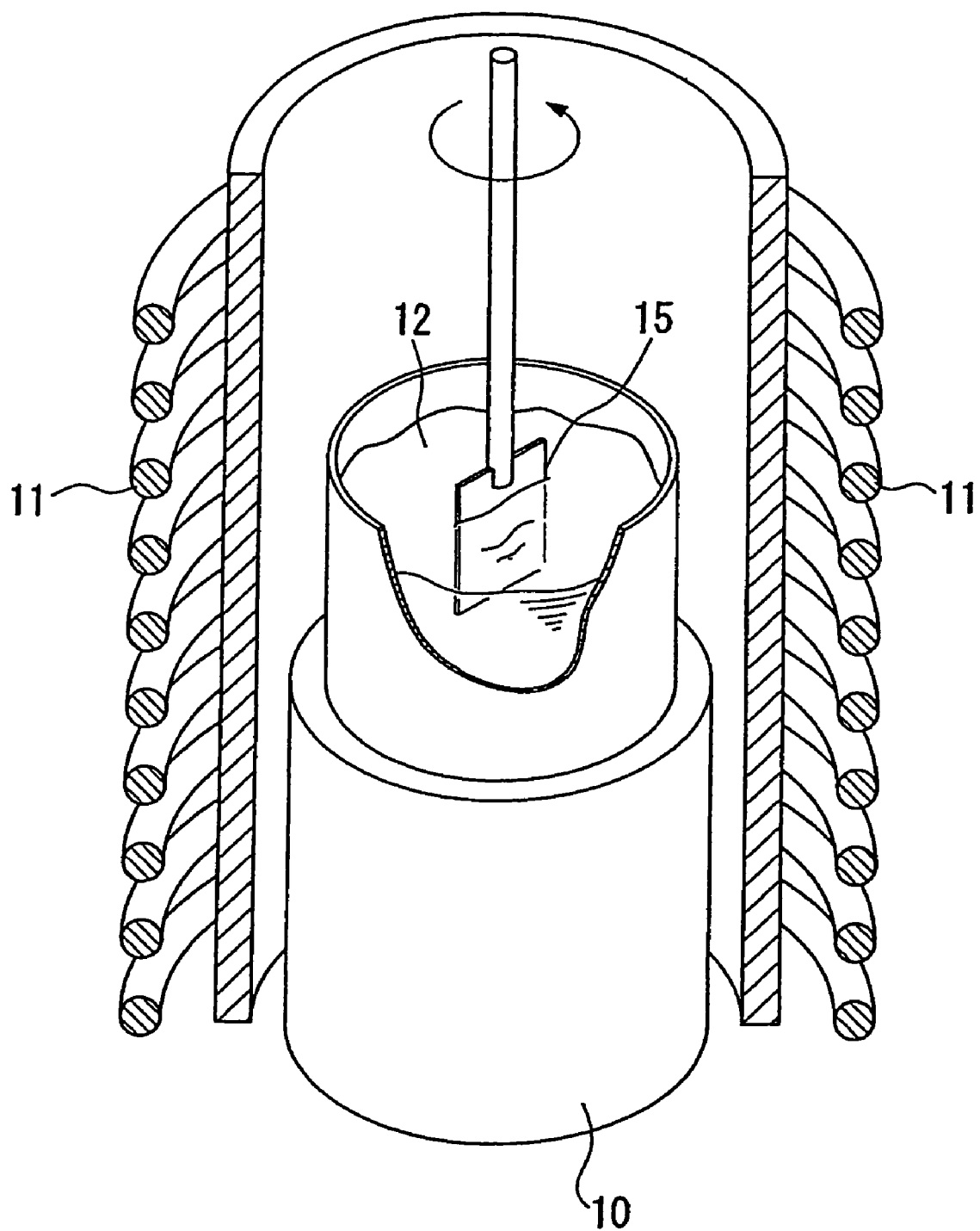
FIG. 3 is a view showing a way of stirring a melt in the process of LPE.

The starting material composition and the flux composition put in the crucible 10 are heated by the heating coil 11 with current running therethrough, and melted into a melt 12. In the step of forming the melt 12, the melt 12 is stirred. This mode is shown in FIG. 3. For example, while heated at about 950° C., the melt 12 is stirred with a stirrer 15. This is for improving the uniformity of the molten condition of the melt 12. Preferably, the stirrer 15 is also formed of Au, like the crucible 10. If the stirrer 15 is formed of Pt, Pt will dissolve out of the stirrer 15 into the melt 12 while the melt 12 is stirred. Accordingly, in order to enjoy the effect of using the crucible 10 that contains Au at least in the site at which the melt 12 is kept in contact with the crucible 10, it is desirable that the stirrer 15 is formed of Au. The terminology "formed of Au" includes not only a case where the stirrer 15 itself is formed of Au but also a case where the stirrer 15 itself is formed of a different substance and is coated with a film of Au as well as a case where the part of the stirrer 15 that may be contacted with the melt 12 is formed of Au and the other part thereof is formed of any other substance than Au.

After stirring the melt 12 with the stirrer 15 has been finished, the temperature of the melt 12 is lowered to, for example, around 800° C. so that the melt 12 is in a super-cooled condition. In this condition, an LPE substrate 13 is contacted with the melt 12 while rotated, as in FIG. 2, whereby a garnet single-crystal film 14 epitaxially grows on the surface (lower face in the drawing) of the LPE substrate 13. Thus having grown, the garnet single-crystal film 14 shall take therein the flux components and Au from the crucible 10 as impurities.

For introducing Au into the Bi-substituted rare earth-iron-garnet single-crystal film of this embodiment, the crucible 10 may contain Au (or Au alloy), and apart from it, Au may be added to the starting material. In the latter case, the crucible 10 to be used may contain Au in at least the site at which the melt 12 is contacted with the crucible 10, or it may be formed of any other material of, for example, one or more (as alloy) of Pt, Rh ad Ir.

In the process of growing the garnet single-crystal film 14, the wafer holder 16 that holds the LPE substrate 13 may be contacted with the melt 12, as in FIG. 2. Therefore, it is desirable that the wafer holder 16 is also formed of Au. As in FIG. 2, the wafer holder 16 holds the LPE substrate 13 at the tip claws thereof. Therefore, at least the tip claws are formed of Au. The meaning of the terminology "formed of Au" is the same as above.

The thickness of the garnet single-crystal film thus obtained through LPE is larger in some degree than that of the Faraday rotator that is desired to be finally obtained herein. This is because the film is polished and then worked into the intended Faraday rotator. The garnet single-crystal film to be worked into Faraday rotators shall have a Faraday rotation angle of 45 degrees to the wavelength of light for service. In other words, the garnet single-crystal film obtained through LPE is polished to have a thickness that ensures its Faraday rotation angle of 45 degrees. Faraday rotator generally has a thickness of around 500 μm or so. After thus polished, the surface of the Faraday rotator is preferably coated with an antireflection film for reducing insertion loss.

Figure 4:
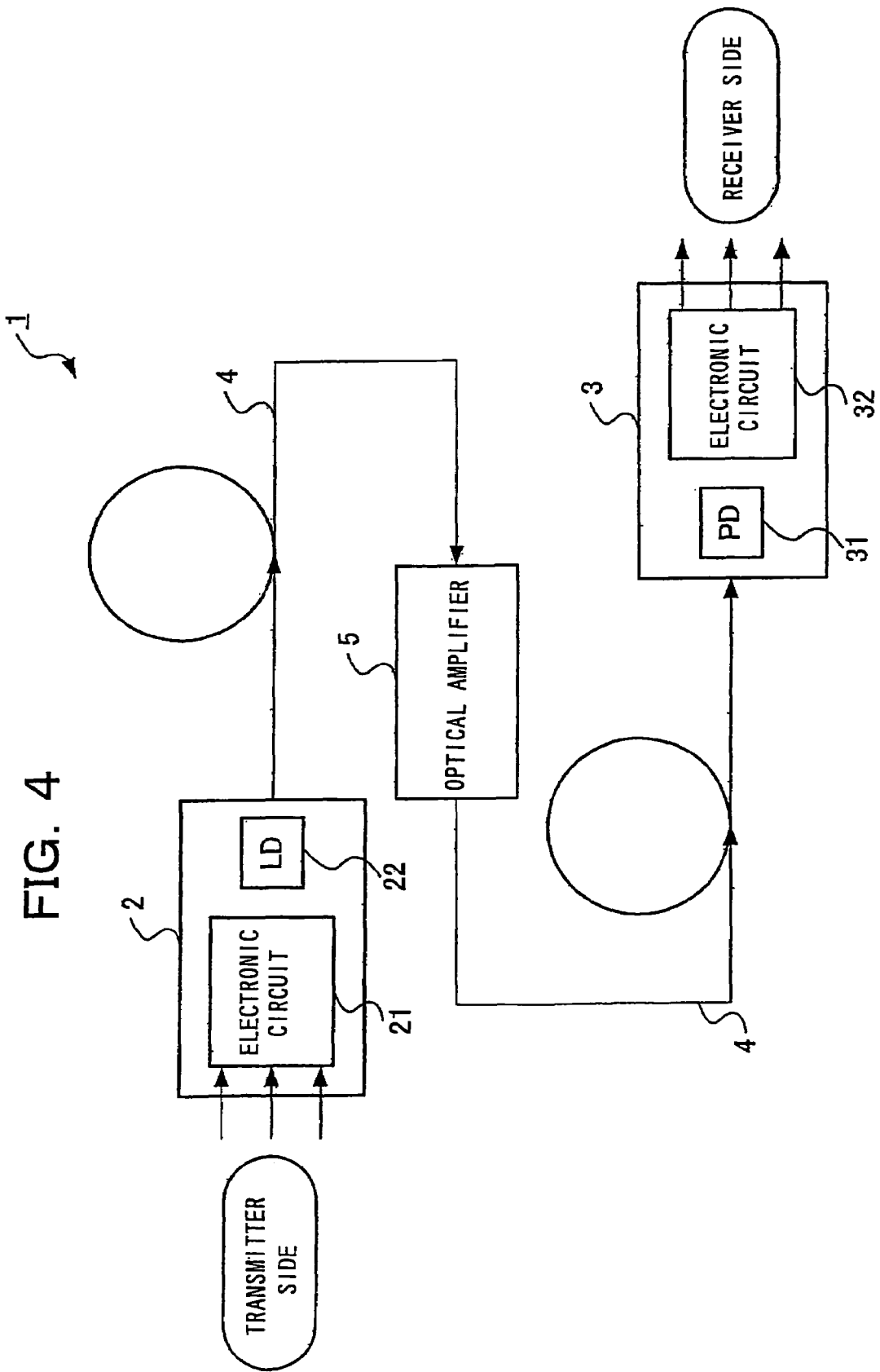
FIG. 4 is a view showing the constitution of an optical communication system in which is used the Faraday rotator of the first embodiment of the invention.
Figure 5:
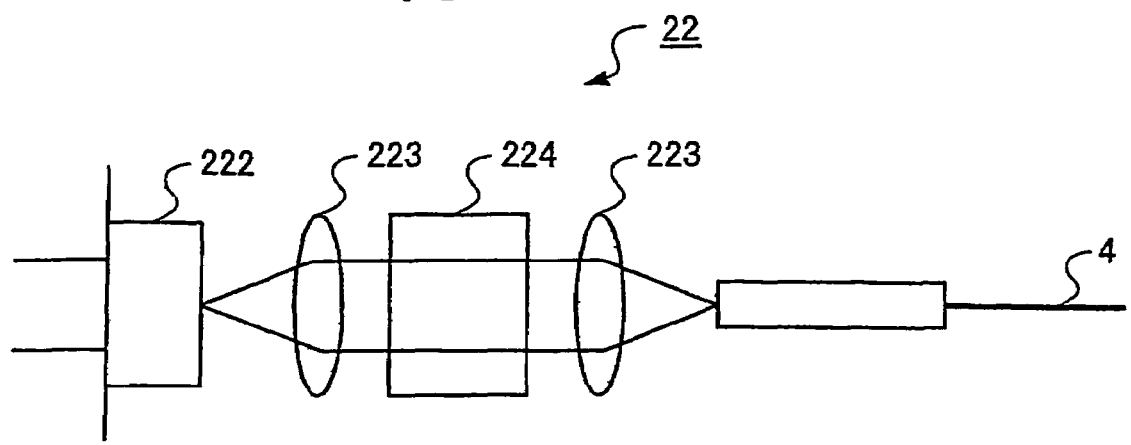
FIG. 5 is a view showing the constitution of an LD module in which is used the Faraday rotator of the first embodiment of the invention.
Figure 6:
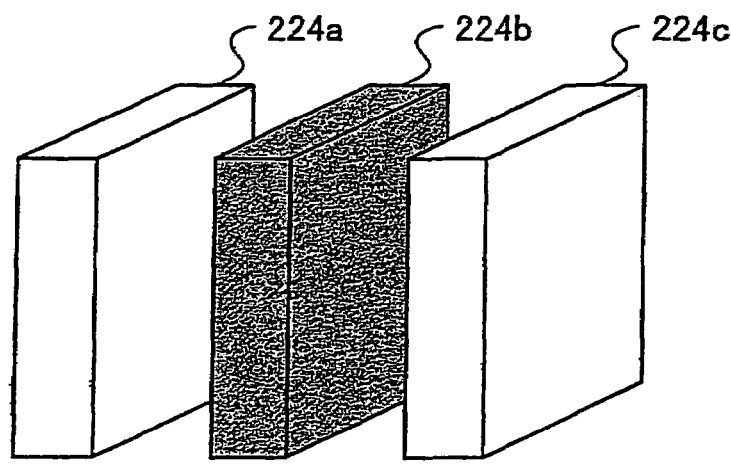
FIG. 6 is a view showing the constitution of an optical isolator in which is used the Faraday rotator of the first embodiment of the invention.

The Faraday rotator thus obtained in the manner as above is used in optical devices such as optical isolator. The optical devices may be used in optical communication systems. With reference to FIG. 4 to FIG. 6, described is an optical communication system 1 to which this embodiment is applied. FIG. 4 shows the constitution of the optical communication system 1. As in FIG. 4, the optical communication system 1 is a system for information transmission by optical signals between a transmitter side and a receiver side. On the transmitter side, disposed is an optical transmitter 2; and on the receiver side, disposed is an optical receiver 3. The optical transmitter 2 is connected with the optical receiver 3 via an optical transmission line 4 of optical fibers. Optical amplifiers 5 are in the optical transmission line 4. The number of the optical amplifiers 5 depends on the length of the optical transmission line 4.

The optical transmitter 2 comprises an electronic circuit 21 and a laser diode (LD) module 22. The electronic circuit 21 receives the data to be transmitted as electric signals, and, after having processed them in a predetermined manner, it outputs the thus-processed data to the LD module 22. Having received the electric signals, the LD module 22 converts them into optical signals and transmits them to the optical transmission line 4.

The optical receiver 3 comprises a photodiode (PD) module 31 and an electronic circuit 32. The PD module 31 converts the optical signals, which it has received from the side of the optical transmitter 2 via the optical transmission line 4, into electric signals and outputs them to the electronic circuit 32. The electronic circuit 32 outputs the thus-inputted electric signals to the side of the receiver.

The optical amplifier 5 provided in the optical transmission line 4 amplifies the optical signals that are transmitted by the optical transmission line 4, for preventing their attenuation.

FIG. 5 shows the constitution of the LD module 22. As in FIG. 5, the LD module 22 comprises an LD222 put in a case; a lens 223 that supplies the light (signal) having a wavelength of 1.31 μm (or 1.55 μm) from the LD222 as parallel rays; an optical isolator 224 that transmits the light (signal) having traveled through the lens 223 only in one direction; and a lens 223 that condenses the light from the optical isolator 224 to supply it to the optical transmission line 4.

FIG. 6 shows the constitution of the optical isolator 224. As in FIG. 6, the optical isolator 224 is so designed that it has a Faraday rotator 224b disposed between two polarizers 224a, 224c. In this embodiment, the Faraday rotator 224b comprises, for example, a hard magnetic garnet single-crystal film. After magnetized by an external magnetic field applied thereto, the hard magnetic garnet single-crystal film keeps the magnetization and becomes a permanent magnet. Therefore, the Faraday rotator 224b does not require an external magnet for imparting a magnetic field thereto. The Faraday rotator 224b may also be formed of a soft, but not hard, magnetic garnet single-crystal film. In that case where the Faraday rotator 224b is formed of such a soft magnetic film, an external magnet, for example, a ring-like permanent magnet is disposed to surround it. The two polarizers 224a, 224c are disposed to be opposite to each other via a predetermined distance there between. When forward light (in the direction of the arrow in the drawing) enters the polarizer 224a, then it goes out of the polarizer 224c toward the light transmission line 4. For the polarizers 224a, 224c, any known material is usable. For example, Corning's Polar Core (trade name) is preferred for them, but is not limitative.

The Faraday rotator 224b rotates the polarization plane of the forward light having passed through the polarizer 224a, for example, by 45 degrees, and emits it toward the polarizer 224c. The polarization axis of the polarizer 224c is rotated by 45 degrees relative to the polarization axis of the polarizer 224a. Accordingly, the polarizer 224c transmits the forward light. On the other hand, the polarization plane of the backward light having entered the polarizer 224c and having passed through the polarizer 224c is further rotated by 45 degrees by the Faraday rotator 224b, and it crosses the polarization axis of the polarizer 224a at right angles. Accordingly, the optical isolator 224 transmits the forward light from the side of the polarizer 224a but blocks the backward light from the side of the polarizer 224c.

In this embodiment, the Faraday rotator 224b is formed of the above-mentioned Bi-substituted rare earth-iron-garnet single-crystal film. The Faraday rotator 224b functions as a part of optical device such as the optical isolator 224. In the above, the optical isolator 224 has been described as one example of optical device. Needless-to-say, however, the Faraday rotator 224b of this embodiment may apply to any other optical device such as optical attenuator, optical circulator and photomagnetic field sensor.

Examples of this embodiments are mentioned below.

EXAMPLE 1-1

Using the device of FIG. 2, a Bi-substituted rare earth-iron-garnet single-crystal film was formed through LPE from starting compounds of bismuth oxide ($Bi_2O_3$, 4 N), ferric oxide ($Fe_2O_3$, 4 N), gadolinium oxide ($Gd_2O_3$, 5 N), terbium oxide ($Tb_4O_7$, 3 N), ytterbium oxide ($Yb_2O_3$, 4 N) and gallium oxide ($Ga_2O_3$, 4 N). The LPE substrate 13 used is formed of (111) garnet single crystal (($GdCa)_3(GaMgZr)_5O_{12}$). The lattice constant of the LPE substrate 13 is 1.2497+/−0.0002 nm. In addition to the above-mentioned starting compounds, a flux composition of lead oxide (PbO, 4 N) and boron oxide ($B_2O_3$, 5 N) was also put into the crucible 10. The crucible 10 is entirely formed of Au. After the starting material composition and the flux composition were put into the crucible, these were heated up to 950° C. to melt the starting material composition, and a melt 12 was thus obtained. Next, the melt 12 was stirred for a predetermined period of time with a stirrer 15 coated with Au. After thus stirred, the melt 12 was cooled to 850° C., and a garnet single-crystal film 14 began to grow. In the process of growing the garnet single-crystal film 14, the LPE substrate 13 was held by a wafer holder 16 coated with Au.

The thus-obtained garnet single-crystal film (Example 1-1) was analyzed for its composition, which was identified as $Bi_{1.0}Gd_{0.7}Tb_{1.1}Yb_{0.2}Fe_{4.1}Ga_{0.9}Au_{0.0037}O_{12}$. This composition was in the latter stage of the garnet single-crystal film growth, and Pb was omitted for detection. Regarding its magnetism, the garnet single-crystal film is a hard magnetic composition. The garnet single-crystal film was cut into a predetermined size, polished and coated with an antireflection film. This gave a Faraday rotator having a size of 1 mm×1 mm×0.5 mm. The insertion loss in this Faraday rotator was measured, and it was 0.01 dB. The insertion loss indicates the attenuation of the light that goes out of a rotator, relative to the incident light having entered it.

A Faraday rotator was formed of a garnet single-crystal film (Comparative Example 1-1) that had been obtained in the same manner as above except that the crucible 10 used was formed of Pt. The composition of the garnet single-crystal film was identified as $Bi_{1.0}Gd_{0.7}Tb_{1.1}Yb_{0.2}Fe_{4.1}Ga_{0.9}Pt_{0.02}O_{12}$. The insertion loss in this Faraday rotator was measured, and it was 0.05 dB.

As in the above, the insertion loss in the Faraday rotator formed of the Au-containing garnet single-crystal film is lower than that of the Faraday rotator formed of the Pt-containing garnet single-crystal film. As so mentioned herein above, Bi-substituted rare earth-iron-garnet single crystal is trivalent. Au is trivalent, and Pt is tetravalent. Accordingly, when Pt is taken in garnet single crystal, it breaks the charge balance of the crystal. As opposed to this, Au is an element to be a trivalent cation, like garnet single crystal, and therefore, even when it is taken in garnet single crystal, it does not break the charge balance of the crystal. In addition, Au is further characterized in that it is hardly taken in garnet single crystal, and even when taken therein only a little, it forms little concentration distribution in the crystal. Accordingly, it may be said that Au has little influence on the insertion loss in the film containing it. The other trivalent elements capable of being used for the crucible 10 for LPE are Rh and Ir. In this Example, Au was used for the crucible 10, but in place of it or alloyed with it, Rh and/or Ir may be used for the crucible 10.

Figure 7:
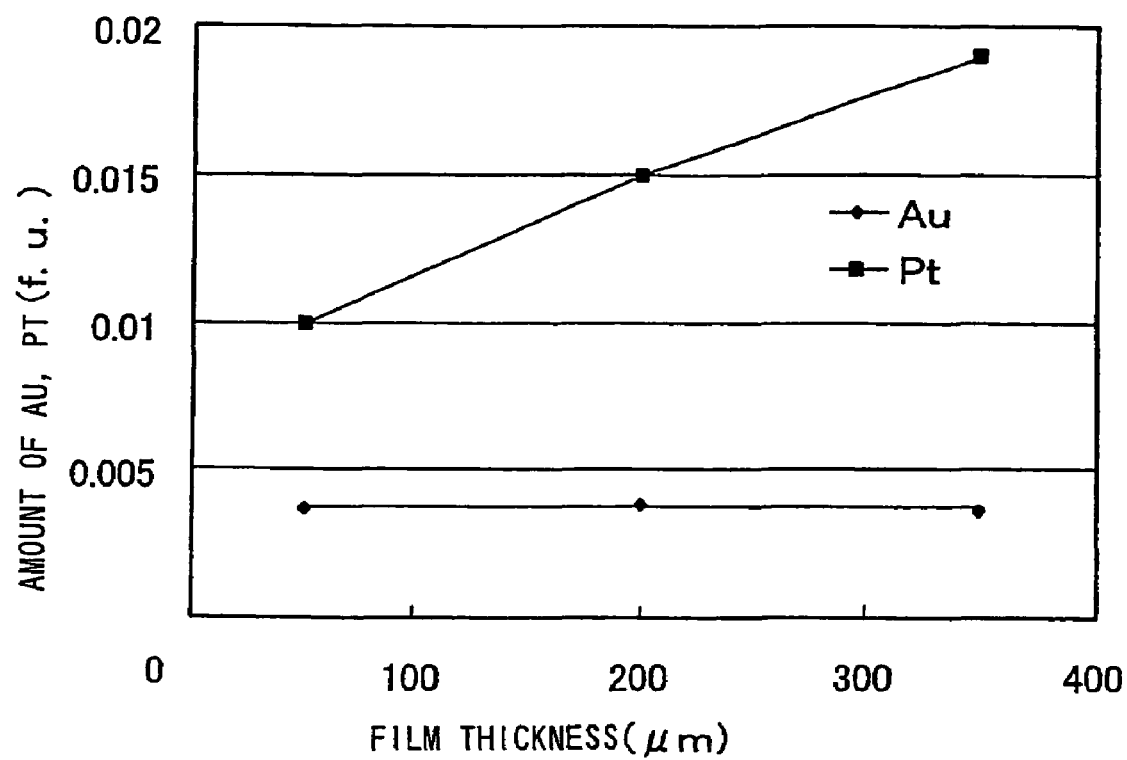
FIG. 7 us a graph showing the Au and Pt concentration distribution in a single-crystal film in the direction of the thickness of the film.

The concentration distribution of Au (Example 1-1) or Pt (Comparative Example 1-1) in the direction of the thickness of each of the two garnet single-crystal films was measured. The results are in FIG. 7. The horizontal axis indicates the thickness (μm) of the garnet single-crystal film; and the vertical axis indicates the amount of Au or Pt (f.u.). In FIG. 7, the side of thickness 0 μm indicates the initial stage of the growth of the garnet single-crystal film, and the side of thickness 400 μm indicates the latter stage of the growth of the film. As in FIG. 7, the Pt concentration is higher than the Au concentration all the time throughout the period of from the initial stage to the latter stage of the growth of the garnet single-crystal film. The Au concentration distribution is almost uniform in the direction of the film thickness, but the Pt concentration distribution linearly increases from the initial stage to the latter stage of the growth of the garnet single-crystal film.

This will be because of some reasons such as those mentioned below. First, the ionic radii of Au, Pt and Fe will have some influence on the element concentration distribution. The ionic radius of Au is 0.99 Å (=0.099 nm); that of Pt is 0.77 Å; and that of Fe is 0.69 Å. The ionic radius of Pt is nearer to that of Fe. Accordingly, Pt may more readily substitute for Fe in the garnet single crystal and will be therefore more readily taken in the crystal. Regarding the crucible 10, the amount of Au or Pt to dissolve out into the flux-containing melt 12 will have some influence on the element concentration distribution. Specifically, Au is more resistant than Pt to corrosion by the melt 12, and therefore the amount of Au to dissolve in the melt 12 is smaller than that of Pt. Moreover, the amount of Pt dissolving in the melt 12 will increase with time. For these reasons as shown in FIG. 7, it is believed that the element concentration distribution in the direction of the film thickness differs between Au and Pt. The ionic radius of Rh is 0.81 Å, and that of Ir is 0.82 Å. The ionic radii of these elements are both larger than that of Pt, and it is believed that these will be more hardly taken in garnet single crystal than Pt.

EXAMPLE 1-2

Under the same condition as in Example 1-1, a Bi-substituted rare earth-iron-garnet single-crystal film was grown from starting compounds of bismuth oxide ($Bi_2O_3$, 4 N), ferric oxide ($Fe_2O_3$, 4 N), gadolinium oxide ($Gd_2O_3$, 5 N), terbium oxide ($Tb_4O_7$, 3 N), ytterbium oxide ($Yb_2O_3$, 4 N), gallium oxide ($Ga_2O_3$, 4 N) and germanium oxide ($GeO_2$, 4 N).

The thus-obtained garnet single-crystal film (Example 1-2) was analyzed for its composition. The composition analysis was effected in the direction of the thickness of the garnet single-crystal film, or that is, in the initial stage of the growth of the film and in the latter stage of the growth thereof. As a result, the composition of the film in the initial stage of the growth thereof was identified as $Bi_{1.0}Gd_{0.7}Tb_{1.1}Yb_{0.2}Pb_{0.03}Fe_{4.3}Ga_{0.7}Ge_{0.03}Au_{0.0034}O_{12}$, and the composition thereof in the latter stage of the film growth was as $Bi_{1.0}Gd_{0.7}Tb_{1.1}Yb_{0.2}Pb_{0.03}Fe_{4.3}Ga_{0.7}Ge_{0.03}Au_{0.0037}O_{12}$. In addition, the magnetic properties of the garnet single-crystal film were measured with VSM (vibrating sample magnetometer). As a result, at the compensation temperature thereof, the saturation magnetization (4 πMs) of the film was 0 G (1 G=0.1 mT), and the coercive force thereof was 4 kOe (1 Oe=1/(4π)×$10^3$ A/m).

Figure 8:
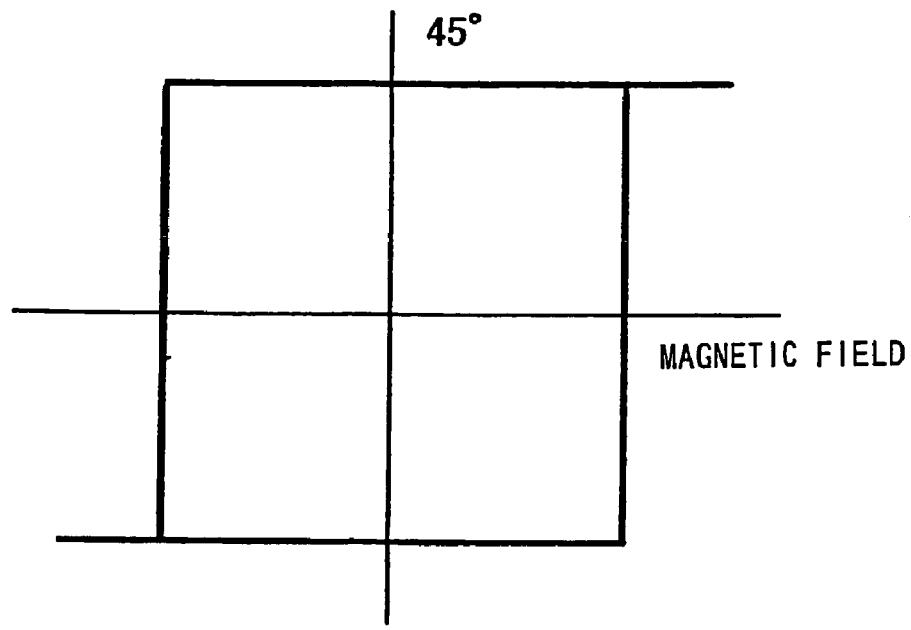
FIG. 8 is a view showing the relationship between the external magnetic field and the Faraday rotation angle of the Faraday rotator of Example 1-2 of the first embodiment of the invention.

The garnet single-crystal film was cut into a predetermined size, polished and coated with an antireflection film. This gave a Faraday rotator having a size of 1 mm×1 mm×0.5 mm. Using a Faraday rotation angle meter, the Faraday rotation performance of the thus-obtained Faraday rotator was measured. FIG. 8 is a graph showing the relationship between the external magnetic field and the Faraday rotation angle of the Faraday rotator of this Example. The horizontal axis indicates a magnetic field, and the vertical axis indicates a Faraday rotation angle (degree). As in FIG. 8, the Faraday rotator of this Example has a good squareness profile.

Figure 9:
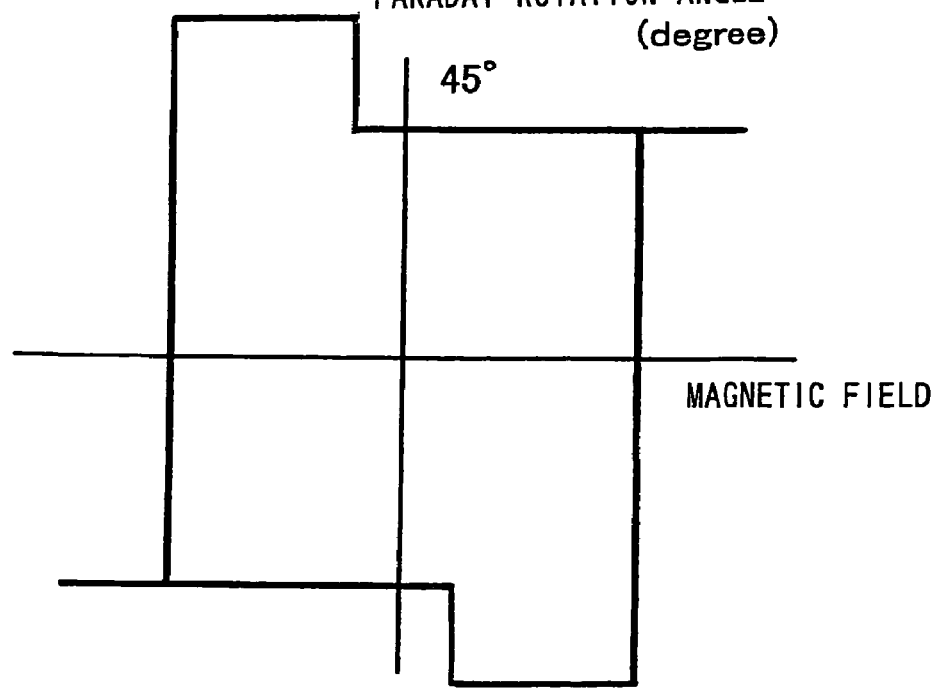
FIG. 9 is a view showing the relationship between the external magnetic field and the Faraday rotation angle of the Faraday rotator of Comparative Example 1-2 for the first embodiment of the invention.

A Faraday rotator was formed of a garnet single-crystal film (Comparative Example 1-2) that had been obtained in the same manner as above except that the crucible 10 used was formed of Pt. The thus-obtained Faraday rotator was analyzed for its composition. Like in Example 1-2, the composition analysis was effected in the initial stage and the latter stage of the growth of the garnet single-crystal film. As a result, the composition of the film in the initial stage of the growth thereof was identified as $Bi_{1.08}Gd_{0.29}Tb_{1.38}Yb_{0.21}Pb_{0.033}Fe_{4.3}Ga_{0.67}Ge_{0.022}Pt_{0.008}O_{12}$, and the composition thereof in the latter stage of the film growth was as $Bi_{1.09}Gd_{0.30}Tb_{1.37}Yb_{0.20}Pb_{0.035}Fe_{4.3}Ga_{0.7}Ge_{0.016}Pt_{0.024}O_{12}$. It is understood that the Pt increase in the film is great from the initial stage to the latter stage of the film growth. In particular, the Pt increase in the garnet single-crystal film is larger than that of any other constitutive elements of the film. Like in Example 1-2, the magnetic properties of the garnet single-crystal film were measured. As a result, at the compensation temperature thereof, the saturation magnetization (4 πMs) of the film was 25 G. The temperature at which the film had the saturation magnetization could not be the compensation temperature of the film in the strict sense of the word, but as so mentioned herein above, it is herein referred to as the compensation temperature. This garnet single-crystal film was worked into a Faraday rotator in the same manner as in Example 1-2, and its Faraday rotation performance was measured. FIG. 9 is a graph showing the relationship between the external magnetic field and the Faraday rotation angle of the Faraday rotator of this Comparative Example. The horizontal axis indicates a magnetic field, and the vertical axis indicates a Faraday rotation angle (degree). As in FIG. 9, a split occurred in the rotation angle profile of the Faraday rotator of this Comparative Example.

Figure 10:
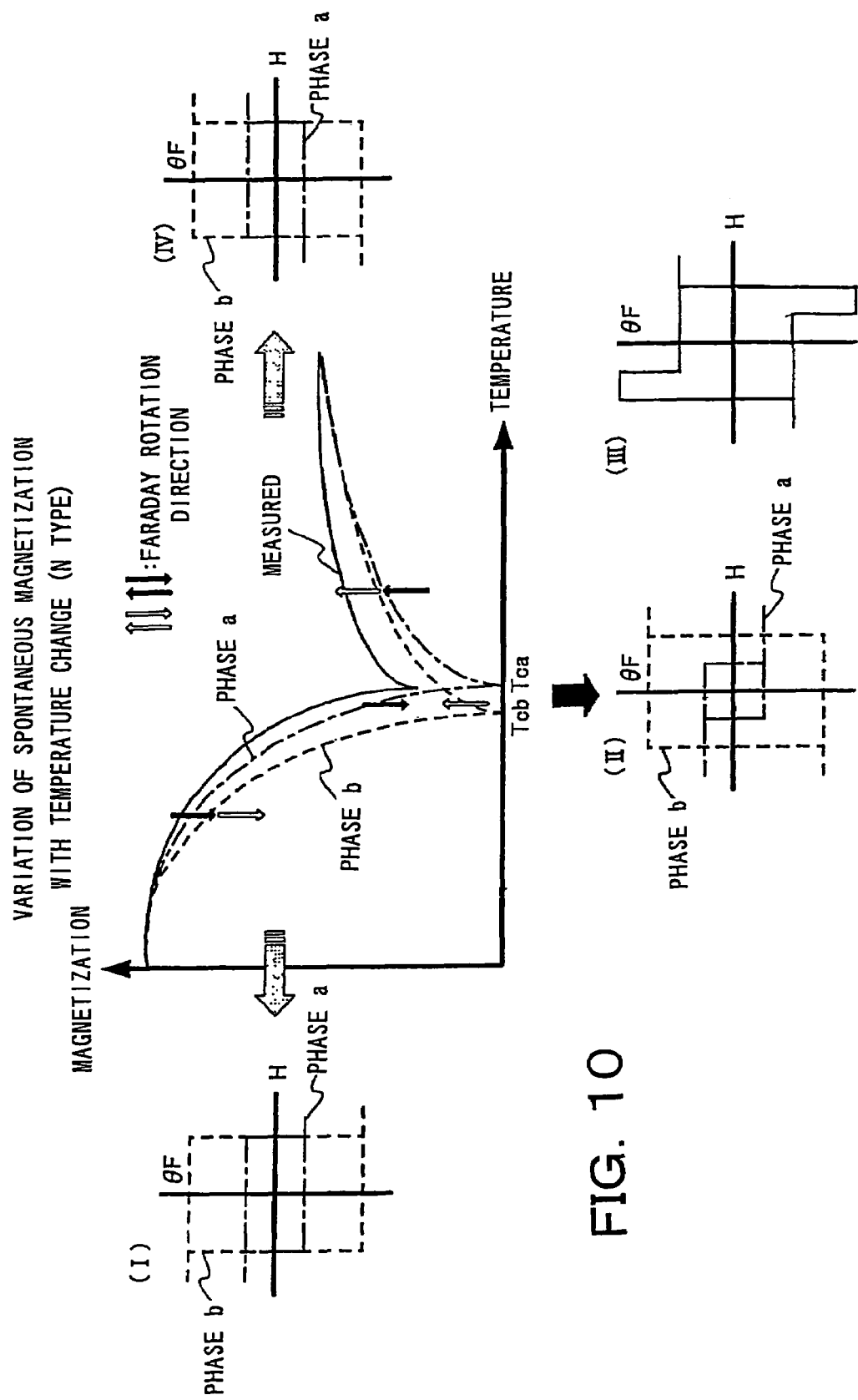
FIG. 10 is a view for explaining the reason of the split of Faraday rotation angles.

The reason why the split as above occurs is not clear. However, we, the present inventors believe that the reason will be because two phases have appeared at different compensation temperatures owing to the concentration gradation of a predetermined element, especially Pt in the garnet single-crystal film that forms the Faraday rotator, and they would cause the occurrence of the split in the rotation angle profile of the Faraday rotator. This is further described with reference to FIG. 10. In FIG. 10, the center graph shows the relationship between the spontaneous magnetization and the temperature (temperature-dependent spontaneous magnetization curve) of the film. The horizontal axis indicates a temperature and the vertical axis indicates spontaneous magnetization. The above-mentioned two phases are phase a and phase b. The compensation temperature of the phase a is Tca, and that of the phase b is Tcb (Tca>Tcb).

In the center graph, the one-dot chain line indicates the temperature-dependent spontaneous magnetization curve of the phase a; and the dotted line indicates the temperature-dependent spontaneous magnetization curve of the phase b. In the center graph, the solid line indicates the temperature-dependent spontaneous magnetization curve of the measured data of the film. The solid line is defined as the proportional addition of the temperature-dependent spontaneous magnetization curve of the phase a and the temperature-dependent spontaneous magnetization curve of the phase b. The arrows applied to the curves show the rotational direction of the light that passes through the phase a and the phase b (herein after referred to as "Faraday rotational direction"). The white arrows indicate the Faraday rotational direction of the phase a; and the black arrows indicate the Faraday rotational direction of the phase b. As in FIG. 10, the Faraday rotation angle in the phase a is toward the downside in the drawing in the temperature range not higher than Tca (this direction is herein after referred to as a first direction). The Faraday rotation angle in the phase b is also toward the first direction in the temperature range not higher than Tcb.

The magnetic hysteresis of the Faraday rotation angle at a predetermined temperature not higher than Tcb is shown in (I) of FIG. 10. As in (I) of FIG. 10, it is believed that both the magnetic hysteresis by the phase a and the magnetic hysteresis by the phase b exist. However, the magnetic hysteresis actually measured at the predetermined temperature has a square profile. The reason for it will be because the Faraday rotation angle in the phase a and the Faraday rotation angle in the phase b may be the same, and the difference in the coercive force between the two phases will be small because the difference in the spontaneous magnetization at the predetermined temperature is small between them.

Next, at a temperature higher than Tcb, the Faraday rotational direction in the phase b is toward the upside in the drawing (second direction), differing from that within the temperature range not higher than Tcb. This is because the direction of the magnetic field to the phase b is reversed via the boundary at Tcb. On the other hand, however, the Faraday rotation angle in the phase a is still in the first direction even at a temperature higher than Tcb within the temperature range not higher than Tca. Accordingly, in the temperature range between Tcb and Tca, the Faraday rotational direction in the phase a is opposite to the Faraday rotational direction in the phase b. In addition, it may be said that the difference between the spontaneous magnetization of the phase a and that of the phase b at a predetermined temperature within the range of from Tcb to Tca is larger than that at a temperature not higher than Tcb. Accordingly, it is understood that there are two different magnetic hysteresis profiles of the Faraday rotation angle separately for the phase a and the phase b, at a predetermined temperature falling between Tcb and Tca, as in (II) of FIG. 10. In fact, however, the actually measured data gave a magnetic hysteresis as in (III) of FIG. 10. It may be recognized that the magnetic hysteresis of (III) is the sum of the magnetic hysteresis of the phase a and that of phase b in (II) of FIG. 10.

At a temperature of higher than Tca, the Faraday rotational direction in the phase a is the same as that in the phase b. In addition, the difference between the spontaneous magnetization of the phase a and that of the phase b is small. Accordingly, as in (IV) of FIG. 10, the magnetic hysteresis actually measured at a predetermined temperature higher than Tca has a square profile, like that within the temperature range not higher than Tcb, even though there exist two different hysteresis loops separately for the phase a and the phase b.

The above is our inventors' understanding of the reason for split occurrence. With no exception, the split always occurs when the concentration gradation of the element, Pt substitutable for the iron site in the magnetic film is significant. Accordingly, reducing the Pt concentration gradation will be effective for preventing the split occurrence.

EXAMPLE 1-3

A Bi-substituted rare earth-iron-garnet single-crystal film was grown like in Example 1-2. Thus obtained, the garnet single-crystal film (Example 1-3) was analyzed for its composition. Both in the initial stage and in the latter stage of the film growth, the grown film had the following chemical composition. The material having this chemical composition is soft magnetic.

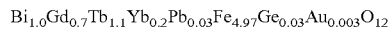

$Bi_{1.0}Gd_{0.7}Tb_{1.1}Yb_{0.2}Pb_{0.03}Fe_{4.97}Ge_{0.03}Au_{0.003}O_{12}$

The garnet single-crystal film was cut into a predetermined size, polished and coated with an antireflection film. This gave a Faraday rotator having a size of 1 mm×1 mm×0.5 mm. The insertion loss in this Faraday rotator was measured, and it was 0.01 dB.

A Faraday rotator was formed of a garnet single-crystal film (Comparative Example 1-3) that had been obtained in the same manner as above except that the crucible 10 used was formed of Pt. The composition of the garnet single-crystal film was $Bi_{1.0}Gd_{0.7}Tb_{1.1}Yb_{0.2}Pb_{0.03}Fe_{4.97}Ge_{0.023}Pt_{0.007}O_{12}$ in the initial stage of the film growth, and was $Bi_{1.0}Gd_{0.7}Tb_{1.1}Yb_{0.2}Pb_{0.03}Fe_{4.97}Ge_{0.017}Pt_{0.022}O_{12}$ in the latter stage thereof. The insertion loss in the Faraday rotator was measured, and it was 0.04 dB.

As in the above, the insertion loss in the Faraday rotator of Example 1-3 is reduced owing to the ideal charge compensation attained therein. Contrary to this, the insertion loss in the Faraday rotator of Comparative Example 1-3 is large since the charge balance thereof has been broken.

As described herein above, this embodiment provides a magnetic Bi-substituted rare earth-iron-garnet material having a reduced insertion loss. In addition, this embodiment provides a hard magnetic, Bi-substituted rare earth-iron-garnet material with no split even at the compensation temperature thereof.

Second Embodiment of the Invention

Next described are the magnetic garnet material, the Faraday rotator, the optical device, the bismuth-substituted rare earth-iron-garnet single-crystal film and the method for producing the film of the second embodiment of the invention.

Hard magnetic, Bi-substituted rare earth-iron-garnet single crystal films are developed these days. It is known that the magnetic hysteresis of the Faraday rotation angle of hard magnetic garnet single-crystal film has a good squareness profile as in FIG. 8.

We, the present inventors have further studied hard magnetic garnet single-crystal films. As a result, we have confirmed that the films generally have a split within a specific temperature range of the service temperature range of Faraday rotators (generally from −40 to 85° C.), as in FIG. 9. In addition, we have found that the coercive force of garnet single-crystal films with such a split is reduced and the films are unfavorable for hard magnetic applications.

Given that situation, this embodiment is to provide a magnetic garnet material of which the Faraday rotation angle keeps a square magnetic hysteresis profile. This embodiment also provides a Faraday rotator and an optical device that comprises the magnetic garnet material. This embodiment further provides a method for producing the magnetic garnet material.

We, the present inventors have studied many Bi-substituted rare earth-iron-garnet single-crystal films of which the Faraday rotation angle shows a magnetic hysteresis profile as in FIG. 9. As a result, we have at last found that the Pt concentration in the face and the back of the garnet single-crystal film of the type greatly varies as compared with the concentration of other elements. Pt is not an element that naturally constitutes Bi-substituted rare earth-iron-garnet single-crystal film, but may be substitutable for the iron site of the garnet single-crystal film. We, the present inventors have found that a Pt concentration gradation is formed from the initial stage to the latter stage of the growth of garnet single-crystal film and it increases with the growth of the film. Needless-to-say, the other elements that constitute garnet single-crystal film have some concentration distribution (generally from a few % to 20%). However, the Pt concentration distribution is remarkable (from 300 to 1000% or so) as compared with the concentration distribution of the other constitutive elements. In addition, the saturation magnetization of garnet single-crystal film is ideally 0 at the compensation temperature thereof, but is actually over 20 G.

Bi-substituted rare earth-iron-garnet single-crystal film is formed through LPE. The process of LPE comprises putting a starting material composition for Bi-substituted rare earth-iron-garnet single-crystal film that comprises bismuth oxide, ferric oxide and rare earth oxides, and a flux composition into a Pt crucible, followed by heating them up to a predetermined temperature to melt the starting material composition to give a melt. In general, the flux composition contains lead oxide and boron oxide. Next, the melt is cooled to a supercooled condition, and then contacted with a LPE substrate while the substrate is rotated, whereby the intended garnet single-crystal film is epitaxially grown on the LPE substrate. It is believed that Pt having been released from the crucible would be taken in the iron site of the garnet single crystal that grows in this process. Bi-substituted rare earth-iron-garnet single-crystal film having a reduced Pt content was formed, and the magnetic hysteresis of the Faraday rotation angle of the film was determined. As a result, it has been confirmed that the film is free from the split as in FIG. 9, within a temperature range for service of the film. The saturation magnetization of the Bi-substituted rare earth-iron-garnet single-crystal film of the type may be 20 G or less, preferably 10 G or less, more preferably 2 G or less at the compensation temperature of the film.

As in the above, this embodiment provides a magnetic garnet material of a single-crystal film that comprises bismuth-substituted rare earth-iron-garnet, wherein the concentration fluctuation of the element that substitutes for the iron site in the single-crystal film is 200% or less and the saturation magnetization of the film at the compensation temperature thereof is 20 G or less. In the magnetic garnet material, one typical element which substitutes for the iron site and of which the concentration fluctuation is controlled is Pt. Preferably, the Pt concentration fluctuation is 200% or less.

The following chemical composition applies to the single-crystal film for the magnetic garnet material of this embodiment.

$$Bi_{3-x}A_xFe_{(5-y)}M_yO_{12}$$

wherein A is one or more selected from a group of rare earth elements including Y, and Ca and Pb; M is one or more selected from a group of Ga, Al, Ge, Sc, In, Si, Ti, Mg, Mn, Zr, Au, Ir, Rh and Pt; $0.2 \leq x \leq 2.5$, and $0 \leq y \leq 2.0$.

In the above-mentioned chemical composition, when at least Ga is selected for M and when y that indicates the amount of Ga falls within a range of $0.8 \leq y \leq 2.0$, then Pt substitution for the iron site in the single-crystal film having the chemical composition is retarded even though the film is formed through LPE in a Pt crucible, and the film is free from the formation of Pt concentration gradation therein.

This embodiment also provides a Faraday rotator that comprises a single-crystal film of bismuth-substituted rare earth-iron-garnet having a composition of the following general formula and an antireflection film formed on the surface of the single-crystal film, wherein the amount of Pt in the single-crystal film is 0.01 or less in terms of the molar ratio thereof and the Pt concentration fluctuation in the face and the back of the single-crystal film is 200% or less.

$$Bi_{3-x}A_xFe_{(5-y)}M_yO_{12}$$

wherein A is one or more selected from a group of rare earth elements including Y, and Ca and Pb; M is one or more selected from a group of Ga, Al, Ge, Sc, In, Si, Ti, Mg, Mn, Zr, Au, Ir, Rh and Pt; $0.2 \leq x \leq 2.5$, and $0 \leq y \leq 2.0$.

This embodiment also provides an optical device comprising a first optical element that inputs forward incident light thereon, a second optical element that is disposed opposite to the first optical element via a predetermined distance therebetween and transmits the forward light, and a Faraday rotator that is disposed between the first optical element and the second optical element so as to rotate the plane of polarization of the light having passed through the first optical element and to transmit it toward the second optical element; wherein the Faraday rotator is formed of a bismuth-substituted rare earth-iron-garnet single-crystal film, and wherein the amount of Pt in the single-crystal film is 0.01 or less in terms of the molar ratio thereof and the Pt concentration fluctuation in the face and the back of the single-crystal film is 200% or less.

This embodiment also provides some methods for retarding the concentration fluctuation of an element, typically Pt which substitutes for the iron site in a single-crystal film of Bi-substituted rare earth-iron-garnet that grows through LPE. These methods apply to LPE in Pt crucibles.

One method comprises growing a garnet single-crystal film through LPE in an inert gas atmosphere. Specifically, this embodiment provides a method for producing a single-crystal film of bismuth-substituted rare earth-iron-garnet in a mode of liquid-phase epitaxial growth, which comprises a step of putting a starting material composition for the bismuth-substituted rare earth-iron-garnet and a flux composition into a crucible, a step of heating and melting the starting material composition to be a melt, a step of cooling the melt to a temperature at which the single-crystal film grows, and a step of contacting the thus-cooled melt with a single-crystal film-growing substrate to thereby make the intended single-crystal film grow on the substrate, and in which the treatment in the melting step and after it is effected in an inert gas atmosphere. Pt forms a compound with oxygen in an oxygen-containing atmosphere such as air and becomes more soluble. Accordingly, the effect of this method is for retarding the Pt dissolution from the crucible used by effecting the treatment in the crucible in a more reducible atmosphere than air.

As another method for retarding Pt dissolution from crucibles, the invention further suggests using a flux composition not containing PbO. In this embodiment, the flux composition not containing PbO is referred to as a non-lead flux composition. Accordingly, this embodiment further provides a method for producing a single-crystal film of bismuth-substituted rare earth-iron-garnet in a mode of liquid-phase epitaxial growth, which comprises a step of putting constitutive oxides for the rare earth-iron-garnet component and a flux component into a crucible, a step of heating and melting the oxides to be a melt, a step of cooling the melt to a temperature at which the bismuth-substituted rare earth-iron-garnet single-crystal film grows, and a step of contacting the thus-cooled melt with a single-crystal film-growing substrate to thereby make the bismuth-substituted rare earth-iron-garnet single-crystal film grow on the substrate, and in which the flux composition is a non-lead flux composition.

In the method, a non-lead flux composition is used in producing a single-crystal film of bismuth-substituted rare earth-iron-garnet in a mode of liquid-phase epitaxial growth, and the single-crystal film thus produced is prevented from being contaminated with PbO from flux.

This embodiment is described more concretely hereinunder.

The magnetic garnet material of this embodiment comprises a single-crystal film of Bi-substituted rare earth-iron-garnet, in which the concentration fluctuation of the element that substitutes for the iron site in the single-crystal film is 200% or less. This is because if the concentration fluctuation of the element such as Pt that substitutes for the iron site in the film is great, the material of hard magnetism will have a split and its coercive force is thereby lowered. The concentration fluctuation is preferably lower, concretely 150% or less, more preferably 100% or less, even more preferably 50% or less. The concentration fluctuation as referred to herein indicates the concentration fluctuation of the substitute element in the direction of the thickness of the single-crystal film. Concretely, when the element concentration in the initial stage of the growth of the single-crystal film is 100 and that in the latter stage thereof is 150, then the concentration fluctuation is (150–100)/100, or that is, 50%.

For reducing the concentration fluctuation of the element that substitutes for the iron site in the Bi-substituted rare earth-iron-garnet single-crystal film in this embodiment, also effective is reduction in insertion loss, apart from the prevention of split occurrence. This is because of the following reasons. When the amount of Pt gradually increases in the process of the growth of the garnet single-crystal film and it fluctuates in the direction of the film thickness, then apart of the garnet single crystal loses its charge balance. When light enters the garnet single-crystal film thus having lost its charge balance, it is absorbed by the film. As a result, the insertion loss in the Faraday rotator formed of the garnet single-crystal film increases. Contrary to this, if the charge balance of the film is well kept as such by reducing the concentration fluctuation of the element that substitutes for the iron site in the film, the insertion loss can be reduced.

As already described herein above with reference to FIG. 1, it is desirable that the amount of Pt in the Bi-substituted rare earth-iron-garnet single-crystal film is as small as possible. However, Pt is readily taken in garnet single-crystal film in the process of growing the film. Therefore, if Pt crucibles are used in the film production, it is difficult to reduce the Pt amount in the film to 0.01 or less in the process of LPE that has heretofore been investigated. The proposal of this embodiment has made it possible to reduce the amount of Pt in the film to 0.01 or less even when Pt crucibles are used in producing the film. The film of this embodiment enjoys the advantage of insertion loss reduction, irrespective of the wavelength of light that enters it.

The prevention of split occurrence is an effect intrinsic to magnetic garnet material of hard magnetism, but the insertion loss reduction appears even in magnetic garnet material of soft magnetism. Accordingly, this embodiment applies to both types of hard magnetism and soft magnetism.

The saturation magnetization of the magnetic garnet material of this embodiment at the compensation temperature thereof is 10 G or less. Of Bi-substituted rare earth-iron-garnet single crystal, the coercive force Hc is represented by Hc=4K/3M, in which K indicates the constant of magnetic anisotropy, and M indicates magnetization. Therefore, the single crystal of lower saturation magnetization has a larger coercive force Hc. This means that smaller saturation magnetization is preferred for magnetic garnet material of hard magnetism. Needless-to-say, the ideal saturation magnetization is 0 G, but in this embodiment, the acceptable saturation magnetization is 20 G or less, preferably 10 G or less.

The concrete chemical composition of the magnetic garnet material of this embodiment is mentioned below. However, the following chemical composition does not always reflect all constitutive elements of the material.

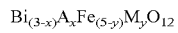

$Bi_{(3-x)}A_xFe_{(5-y)}M_yO_{12}$ wherein A is one or more selected from a group of rare earth elements including Y, and Ca and Pb; M is one or more selected from a group of Ga, Al, Ge, Sc, In, Si, Ti, Mg, Mn, Zr, Au, Ir, Rh and Pt; $0.2 \leq x \leq 2.5$, and $0 \leq y \leq 2.0$.

In this, M is an element substitutable for the iron site of the crystal. In this embodiment that includes the element substitutable for the iron site, the indispensable requirement is that the concentration fluctuation of every substitute element is 200% or less. For example, a case that contains Ga, Ge and Pt is described. In this case, if the Pt concentration fluctuation is over 200%, the case is outside the scope of this embodiment even through the concentration fluctuation of the other two, Ga and Ge is not over 50% each.

In the magnetic garnet material that comprises a single-crystal film of bismuth-substituted rare earth-iron-garnet of this embodiment, the element A is one or more selected from a group of rare earth elements including Y (Y, Gd, Tb, Yb, Sm, Eu, Dy, Lu, Tm, Er, Ho, La, Ce, Pr, Nd), and Ca and Pb. x that indicates the amount of the element A is $0.2 \leq x \leq 2.5$. If x is smaller than 0.2, the amount of Bi of which the ionic radius is large relatively increases, and if so, the single-crystal film growing through LPE on an LPE substrate could not match with the substrate in point of the lattice constant. Contrary to this, if x is larger than 2.5, the amount of Bi relatively decreases, and if so, the Faraday rotation performance of the film material will be low. As a result, the thickness of the garnet single-crystal film must be increased, but such thick garnet single-crystal film is difficult to form through LPE and the productivity of the film lowers. Preferably, $1.0 \leq x \leq 2.3$, more preferably $1.3 \leq x \leq 2.0$. Pb is not an element to be positively added to the material, but is incorporated into the material from the PbO-containing flux composition used in growing the film for the material through LPE. Like in the first embodiment of the invention, it is also desirable that three elements of Gd, Tb and Yb are selected for the rare earth elements of the material of this embodiment.

In the Bi-substituted rare earth-iron-garnet material of this embodiment, M is an element to substitute for a part of Fe, and it is one or more selected from a group of Ga, Al, Ge, Sc, In, Si, Ti, Mg, Mn, Zr, Au, Ir, Rh and Pt. Of those, Ga is the most desirable element in view of easy growth of the garnet single-crystal film containing it. In addition, Ga is effective for preventing the iron site in garnet single crystal from being substituted with Pt. In case where the amount of Pt in the material is reduced, it is desirable that Ge is in the material for charge compensation for Pb that is derived from the flux composition.

y that indicates the degree of substitution of Fe with M satisfies $0 \leq y \leq 2.0$. However, for hard magnetic materials, or that is, for those showing a square magnetic hysteresis, y is preferably at least 0.1. On the other hand, if y is more than 2.0, unnecessary nuclei form in the melt to give the intended garnet single-crystal film and, if so, the garnet single-crystal film could not well grow. The preferred range of y for obtaining hard magnetic garnet single-crystal film is $0.3 \leq y \leq 1.7$, more preferably $0.4 \leq y \leq 1.5$. The element M mentioned above is not limited to those intentionally added to the material but includes any others that will be inevitably added thereto during production. One typical example of such inevitable elements is Pt that is derived from crucibles used in LPE.

The bismuth-substituted rare earth-iron-garnet single-crystal film of this embodiment may be produced through LPE. Production of the bismuth-substituted rare earth-iron-garnet single-crystal film is described with reference to FIG. 2 and FIG. 3 already referred to herein above. First, a starting material composition and a flux composition are put into a crucible 10. The starting material composition contains ferric oxide, rare earth oxide and bismuth oxide. The flux composition contains lead oxide and boron oxide. However, these are examples and are not limitative. If desired, they may contain any other oxides and flux components, depending on the chemical composition of the garnet single-crystal film that is intended to be obtained herein. The ability of the lead oxide-containing flux composition to dissolve the crucible 10 is high. Therefore, when Pt is used for the material of the crucible 10, it is desirable that the flux composition is a non-lead flux composition not containing lead oxide. Specific examples of the flux composition not containing lead oxide are $Bi_2O_3$ alone, a mixture of $Bi_2O_3$ and $B_2O_3$, and a mixture of $Bi_2O_3$, $B_2O_3$ and $Na_2O$.

The most popular material for the crucible 10 is Pt. However, this embodiments allows use of Au for the crucible 10. This is because the solubility of Au in flux is low, and, even if Au is in the magnetic garnet material, it has no negative influence on the material, dislike Pt. The embodiment of using Au for the crucible 10 includes a case where the crucible 10 is entirely formed of Au, and a case where the crucible 10 is partly formed of Au, for example, only the inner wall of the crucible 10 is formed of Au. The concept of the embodiment includes not only using pure Au but also using Au alloys. The element to be alloyed with Au includes Ir, Rh and Pt.

The starting material composition and the flux composition put in the crucible 10 are heated by the heating coil 11 with current running therethrough, and melted into a melt 12. For example, while heated at about 950° C., the melt 12 is stirred with a stirrer 15. This is for improving the uniformity of the molten condition of the melt 12. Preferably, the stirrer 15 is also formed of Au, like the crucible 10. If the stirrer 15 is formed of Pt, Pt will dissolve out of the stirrer 15 into the melt 12 while the melt 12 is stirred. Accordingly, in order to enjoy the effect of using the crucible 10 that contains Au at least in the site at which the melt 12 is kept in contact with the crucible 10, it is desirable that the stirrer 15 is formed of Au. As so mentioned herein above, the terminology "formed of Au" includes not only a case where the stirrer 15 itself is formed of Au but also a case where the stirrer 15 itself is formed of a different substance and is coated with a film of Au as well as a case where the part of the stirrer 15 that may be contacted with the melt 12 is formed of Au and the other part thereof is formed of any other substance than Au.

After stirring the melt 12 with the stirrer 15 has been finished, the temperature of the melt 12 is lowered to, for example, around 800° C. so that the melt 12 is in a supercooled condition. In this condition, an LPE substrate 13 is contacted with the melt 12 while rotated whereby a garnet single-crystal film 14 epitaxially grows on the surface of the LPE substrate 13.

In the process of growing the garnet single-crystal film 14, the wafer holder 16 that holds the LPE substrate 13 may be contacted with the melt 12. Therefore, it is desirable that the wafer holder 16 is also formed of Au. The wafer holder 16 holds the LPE substrate 13 at the tip claws thereof. Therefore, at least the tip claws are formed of Au.

In case where the single-crystal film is produced through LPE, the atmosphere is generally air. However, when the crucible 10 is formed of Pt and when the oxygen content is over 20% by volume of the atmosphere, Pt forms a compound with oxygen and becomes more soluble. Therefore, in case where such Pt crucible 10 is used, it is desirable that the garnet single-crystal film is produced through LPE in a more reducible atmosphere than air, for example, an inert gas atmosphere such as Ar for more effectively preventing the garnet single-crystal film formed from being contaminated with Pt. The garnet single-crystal film produced in such an oxygen-poor atmosphere may have oxygen defects, but the oxygen defects may be removed by heat treatment of the film (for example, by heating the film at 800° C. for 30 hours). The atmosphere that is more reducible than air in this embodiment includes an atmosphere of inert gas alone, and an inert gas atmosphere that contains 20% or less by volume of oxygen. This is because the oxygen content of 20% or less by volume may suppress the Pt dissolution to the acceptable range.

The thickness of the garnet single-crystal film thus obtained through LPE is larger in some degree than that of the Faraday rotator that is desired to be finally obtained herein. This is because the film is polished and then worked into the intended Faraday rotator. The garnet single-crystal film to be worked into Faraday rotators shall have a Faraday rotation angle of 45 degrees to the wavelength of light for service. In other words, the garnet single-crystal film obtained through LPE is polished to have a thickness that ensures its Faraday rotation angle of 45 degrees. Faraday rotator generally has a thickness of around 500 μm or so. After thus polished, the surface of the Faraday rotator is preferably coated with an antireflection film for reducing insertion loss.

Examples of this embodiments are mentioned below.

EXAMPLE 2-1

Using the device of FIG. 2, a Bi-substituted rare earth-iron-garnet single-crystal film was formed through LPE from starting compounds of bismuth oxide ($Bi_2O_3$, 4 N), ferric oxide ($Fe_2O_3$, 4 N), gadolinium oxide ($Gd_2O_3$, 5 N), terbium oxide ($Tb_4O_7$, 3 N), ytterbium oxide ($Yb_2O_3$, 4 N), gallium oxide ($Ga_2O_3$, 4 N), and germanium oxide ($GeO_2$, 4 N). The LPE substrate 13 used is formed of (111) garnet single crystal (($GdCa)_3(GaMgZr)_5O_{12}$). The lattice constant of the LPE substrate 13 is 1.2497+/−0.0002 nm. In addition to the above-mentioned starting compounds, a flux composition of lead oxide (PbO, 4 N) and boron oxide ($B_2O_3$, 5 N) was also put into the crucible 10. The crucible 10 is entirely formed of Pt. After the starting material composition and the flux composition were put into the crucible, these were heated up to 950° C. to melt the starting material composition. Then, the resulting melt 12 was stirred for a predetermined period of time with a Pt stirrer 15. After thus stirred, the melt 12 was cooled to 850° C., and a garnet single-crystal film 14 began to grow. In the process of growing the garnet single-crystal film 14, the LPE substrate 13 was held by a wafer holder 16 of Pt.

The thus-obtained garnet single-crystal film (Example 2-1) was analyzed for its composition. As a result, the composition of the garnet single-crystal film in the initial stage of the growth thereof was identified as $Bi_{1.1}Gd_{0.18}Tb_{1.38}Yb_{0.3}Pb_{0.03}Fe_{3.99}Ga_{1.01}Ge_{0.03}O_{12}$, and the composition thereof in the latter stage of the film growth was as $Bi_{1.1}Gd_{0.18}Tb_{1.38}Yb_{0.3}Pb_{0.035}Fe_{4.0}Ga_{1.0}Ge_{0.035}O_{12}$. The Pt content of the film was below the detection level. In Example 2-1, the elements to substitute for the iron site were Ga and Ge, and their concentration fluctuation was 1% and 17%, respectively. The garnet single-crystal film was cut into a predetermined size, and polished, and its magnetic properties were measured at different temperatures. As a result, at the compensation temperature thereof, the saturation magnetization (4 πMs) of the film sample was 3 G, and the coercive force Hc thereof was 3.5 kOe. The temperature at which the film had the saturation magnetization could not be the compensation temperature of the film in the strict sense of the word, but as so mentioned herein above, it is herein referred to as the compensation temperature. Using a Faraday rotation angle meter, the magnetic hysteresis of the Faraday rotation angle of the garnet single-crystal film was determined, and it showed a good squareness profile as in FIG. 8.

Next, the garnet single-crystal film of Example 2-1 was coated with an antireflection film, and worked into a Faraday rotator having a size of 1 mm×1 mm×0.5 mm. The insertion loss in this Faraday rotator that had received light having a wavelength of 1.31 μm was measured, and it was 0.01 dB.

A garnet single-crystal film (Comparative Example 2-1) was formed basically in the same manner as above except that its Ga content was reduced. The chemical composition of the garnet single-crystal film in the initial stage of the growth thereof was identified as $Bi_{1.1}Gd_{0.18}Tb_{1.39}Yb_{0.3}Pb_{0.03}Fe_{4.46}Ga_{0.5}Ge_{0.03}Pt_{0.01}O_{12}$, and the chemical composition thereof in the latter stage of the film growth was as $Bi_{1.1}Gd_{0.18}Tb_{1.38}Yb_{0.3}Pb_{0.04}Fe_{4.4}Ga_{0.53}Ge_{0.02}Pt_{0.04}O_{12}$. As in these, the film had a Pt concentration gradation increasing from the initial stage to the latter stage of the film growth. In Comparative Example 2-1, the elements to substitute for the iron site were Ga, Ge and Pt, and their concentration fluctuation was 6%, 33% and 300%, respectively. To that effect, the concentration fluctuation of one element Pt of substituting for the iron site in Comparative Example 2-1 is 300%, and is over 200%.

In the same manner as in Example 2-1, the magnetic properties of the garnet single-crystal film of Comparative Example 2-1 were measured. As a result, at its compensation temperature, the saturation magnetization (4 $\pi$Ms) of the film was 30 G. Using a Faraday rotation angle meter, the magnetic hysteresis of the Faraday rotation angle of the garnet single-crystal film at its compensation temperature was determined, and it gave a split as in FIG. 9. Also in the same manner as in Example 2-1, the insertion loss in the film at a wavelength of 1.31 μm was measured, and it was 0.06 dB.

As in the above, the Faraday rotator formed of the garnet single-crystal film not substantially containing Pt is free from the split given by the Faraday rotator formed of the Pt-containing garnet single-crystal film. This will be because of the following reasons. Pt once taken in garnet single crystal and having formed a concentration gradation therein breaks the charge balance of the film of garnet single crystal. Thus having lost its charge balance, the film gives a split and its insertion loss increases.

The films of Example 2-1 and Comparative Example 2-1 were produced substantially under the same condition. As so mentioned herein above, the Pt content of the garnet single-crystal film of Example 2-1 is under the detection level. This is because of the difference in the Ga content of the films of Example 2-1 and Comparative Example 2-1. Specifically, the ionic radii of Ga and Pt are near to that of Fe, and when much Ga substitutes for the iron site, then Pt could no more substitute for Fe. As a result, even if Pt dissolves out of the crucible 10, it will be hardly taken in the garnet single-crystal film.

EXAMPLE 2-2

A Bi-substituted rare earth-iron-garnet single-crystal film was grown under the same condition as in Example 2-1, except that the film growing atmosphere was an Ar gas atmosphere having an oxygen content of 5% by volume and the film was modified to have a different composition.

In the same manner as in Example 2-1, the garnet single-crystal film (Example 2-2) was analyzed for its composition. As a result, the chemical composition of the garnet single-crystal film in the initial stage of the growth thereof was identified as $Bi_{1.1}Gd_{0.18}Tb_{1.39}Yb_{0.3}Pb_{0.03}Fe_{4.7}Ga_{0.27}Ge_{0.03}Pt_{0.005}O_{12}$, and the composition thereof in the latter stage of the film growth was as $Bi_{1.1}Gd_{0.18}Tb_{1.39}Yb_{0.3}Pb_{0.03}Fe_{4.7}Ga_{0.27}Ge_{0.025}Pt_{0.01}O_{12}$. The data confirm that even though the Pt crucible 10 is used in growing garnet single crystal, the Pt content of the resulting garnet single-crystal film could be reduced so far as the film growth is effected in an inert gas atmosphere.

In Example 2-2, the elements to substitute for the iron site were Ga, Ge and Pt, and their concentration fluctuation was 0%, 17% and 100%, respectively. The garnet single-crystal film was cut into a predetermined size, and polished, and its magnetic properties were measured in the same manner as in Example 2-1. As a result, at the compensation temperature thereof, the saturation magnetization (4 $\pi$Ms) of the film sample was 4 G, and the coercive force Hc thereof was 2.5 kOe. The magnetic hysteresis of the Faraday rotation angle of the garnet single-crystal film was determined also in the same manner as in Example 2-1, and it showed a good squareness profile. Next, the garnet single-crystal film was coated with an antireflection film, and worked into a Faraday rotator having a size of 1 mm×1 mm×0.5 mm. The insertion loss in this Faraday rotator that had received light having a wavelength of 1.31 μm was measured, and it was 0.01 dB.

EXAMPLE 2-3

A Bi-substituted rare earth-iron-garnet single-crystal film was grown under the same condition as in Example 2-1, except that the flux composition was a mixture of $Bi_2O_3$ and $B_2O_3$, the starting material composition did not contain germanium oxide and the film was modified to have a different composition.

In the same manner as in Example 2-1, the garnet single-crystal film (Example 2-3) was analyzed for its composition. As a result, the chemical composition of the garnet single-crystal film in the initial stage of the growth thereof was identified as $Bi_{1.1}Gd_{0.22}Tb_{1.38}Yb_{0.3}Fe_{4.25}Ga_{0.75}Pt_{0.002}O_{12}$, and the composition thereof in the latter stage of the film growth was as $Bi_{1.1}Gd_{0.22}Tb_{1.38}Yb_{0.3}Fe_{4.25}Ga_{0.75}Pt_{0.0025}O_{12}$. The data confirm that even though the Pt crucible 10 is used in growing garnet single crystal, the Pt content of the resulting garnet single-crystal film could be reduced so far as the film growth is effected in an inert gas atmosphere. In Example 2-3, the flux composition is a non-lead flux composition not containing PbO, and therefore the film contained no Pb.

In Example 2-3, the elements to substitute for the iron site were Ga and Pt, and their concentration fluctuation was 0% and 25%, respectively. The garnet single-crystal film was cut into a predetermined size, and polished, and its magnetic properties were measured in the same manner as in Example 2-1. As a result, at the compensation temperature thereof, the saturation magnetization (4 $\pi$Ms) of the film sample was 2 G, and the coercive force Hc thereof was 4 kOe. The magnetic hysteresis of the Faraday rotation angle of the garnet single-crystal film was determined also in the same manner as in Example 2-1, and it showed a good squareness profile. Next, the garnet single-crystal film was coated with an antireflection film, and worked into a Faraday rotator having a size of 1 mm×1 mm×0.5 mm. The insertion loss in this Faraday rotator that had received light having a wavelength of 1.31 μm was measured, and it was 0.01 dB.

EXAMPLE 2-4

According to the same process as in Example 2-1, multiple garnet single-crystal films having a different Pt content were produced. The Pt concentration fluctuation of these garnet single-crystal films in the initial stage and the latter stage of the film growth was determined. In addition, the magnetic hysteresis of the Faraday rotation angle, the saturation magnetization (4 $\pi$Ms) and the coercive force Hc of the garnet single-crystal films were measured at the compensation temperature of each film. The data are given in Table 1.

TABLE 1

| No. | Pt Concentration Fluctuation (%) | Magnetic Hysteresis of Faraday Rotation Angle | Saturation Magnetization (G) | Coercive Force (kOe) |
|---|---|---|---|---|
| 1 | 490 | split occurred | 50 | — |
| 2 | 300 | split occurred | 30 | — |
| 3 | 180 | squareness profile | 15 | 1 |
| 4 | 100 | squareness profile | 4 | 2.5 |
| 5 | 54 | squareness profile | 3 | 3 |
| 6 | 25 | squareness profile | 2 | 4 |

Note:
The magnetic hysteresis, the saturation magnetization and the coercive force were measured at the compensation temperature of each film.

As in Table 1, it is understood that the Pt concentration fluctuation over 200% causes a split and increases the saturation magnetization to larger than 20 G. The coercive force of the samples having the split could not be measured accurately. As opposed to these, the samples of which the Pt concentration fluctuation is smaller than 200% have no split, and the magnetic hysteresis of the Faraday rotation angle thereof shows a squareness profile.

EXAMPLE 2-5

A Bi-substituted rare earth-iron-garnet single-crystal film was grown in the same manner as in Example 2-1, except that the crucible 10, the stirrer 15 and the wafer holder 16 were all formed of Au. Thus obtained, the garnet single-crystal film (Example 2-5) was analyzed for its composition. Both in the initial stage and in the latter stage of the film growth, the grown film had the following chemical composition. The material having this chemical composition is soft magnetic.

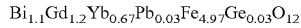

$Bi_{1.1}Gd_{1.2}Yb_{0.67}Pb_{0.03}Fe_{4.97}Ge_{0.03}O_{12}$

The garnet single-crystal film was cut into a predetermined size, polished and coated with an antireflection film. This gave a Faraday rotator having a size of 1 mm×1 mm×0.5 mm. The insertion loss in this Faraday rotator at a wavelength of 1.31 μm was measured, and it was 0.01 dB. In Example 2-5, the element that substituted for the iron site was Ge, and its concentration fluctuation was 0%.

A Faraday rotator was formed of a garnet single-crystal film (Comparative Example 2-5) that had been obtained in the same manner as above except that the crucible 10, the stirrer 15 and the wafer holder 16 were all formed of Pt. The composition of the garnet single-crystal film was $Bi_{1.1}Gd_{1.2}Yb_{0.67}Pb_{0.03}Fe_{4.97}Ge_{0.023}Pt_{0.007}O_{12}$ in the initial stage of the film growth, and was $Bi_{1.1}Gd_{1.2}Yb_{0.67}Pb_{0.03}Fe_{4.97}Ge_{0.017}Pt_{0.022}O_{12}$ in the latter stage thereof. The insertion loss in the Faraday rotator at a wavelength of 1.31 μm was measured, and it was 0.04 dB.

As in the above, the insertion loss in the Faraday rotator of Example 2-5 is reduced owing to the ideal charge compensation attained therein. Contrary to this, the insertion loss in the Faraday rotator of Comparative Example 2-5 is large since the charge balance thereof has been broken.

In Comparative Example 2-5, the elements that substituted for the iron site were Ge and Pt, and their concentration fluctuation was 26% and 214%, respectively.

As described herein above, this embodiment provides a hard magnetic, Bi-substituted rare earth-iron-garnet material with no split even at the compensation temperature thereof. In addition, this embodiment also provides a magnetic Bi-substituted rare earth-iron-garnet material having a reduced insertion loss.

Third Embodiment of the Invention

Figure 11:
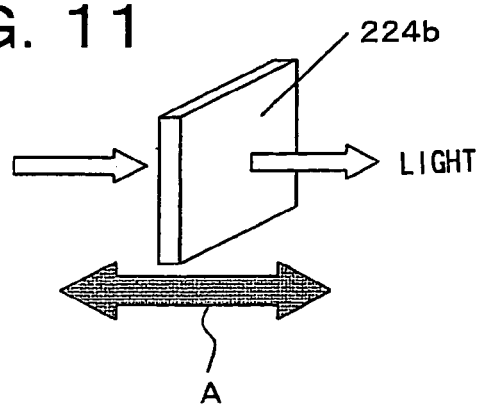
FIG. 11 is a view showing the direction in which light runs through a Faraday rotator and the direction of the magnetic field around the rotator.

Next described is the Faraday rotator and the optical device of the third embodiment of the invention with reference to FIG. 10 to FIG. 18. Bi-substituted rare earth-iron-garnet single-crystal film grown through LPE is much used for Faraday rotators in optical isolators, optical circulators and the like for use in optical communication systems. Optical isolator is a type of optical device, and its role is to transmit light only in one direction and to interrupt the light that has reflected in its running course to turn back. Based on Faraday effect, Faraday rotator has a function of rotating the plane of polarization of light, and when it is used in optical isolator, it acts to rotate the polarization of plane of light by 45 degrees. One typical structure of optical isolator comprises a Faraday rotator, two polarizers or polarizing isolators between which the Faraday rotator is sandwiched and which transmit only unidirectionally-polarized light, and an external magnet having the function of magnetically saturating the Faraday rotator. FIG. 11 shows the direction in which a Faraday rotator transmits light, and the direction of the magnetic field around the rotator. As in FIG. 11, a magnetic filed is applied to the Faraday rotator 224b, for example, by an external magnet in the direction of the arrow A that is parallel to the light-traveling direction.

One recent investigation in the art is for realizing a hard magnetic, Bi-substituted rare earth-iron-garnet single-crystal film by modifying the composition of a soft magnetic, Bi-substituted rare earth-iron-garnet single crystal film (for example, see JP-A 9-185027). Hard magnetic Faraday rotators, or that is, those of permanent magnetism are extremely favorable for down-sized and low-priced optical isolators, as they do not require permanent magnets for imparting a magnetic field thereto. For hard magnetic, Bi-substituted rare earth-iron-garnet single-crystal film, elements of large magnetic moment such as Tb, Gd, Eu and Ho are selected for the rare earth elements and iron is substituted with a non-magnetic element such as Ga or Al. Thus modified, the spontaneous magnetization M of the Bi-substituted rare earth-iron-garnet single-crystal film may be reduced at around the operation temperature of optical isolator, and, as a result, the film may have a square hysteresis profile of magnetism and its coercive force Hc may be enlarged.

Regarding the temperature characteristic of the spontaneous magnetization M thereof, Bi-substituted rare earth-iron-garnet single-crystal film that contains a large amount of rare earth elements such as Tb, Gd, Eu and Ho has a compensation temperature at which its spontaneous magnetization M is almost 0. At the compensation temperature thereof, the overall magnetic moment of the rare earth element ions is the same as that of the Fe ions in the film, and the apparent magnetization of the film is almost 0. In general, the coercive force Hc of permanent magnet is larger when the spontaneous magnetization M is smaller. Accordingly, it is desirable that the magnetic film for use in optical communication is so designed that its compensation temperature may fall within the operation range, from −40 to 85° C. of optical devices for communication and that its spontaneous magnetization M could be lower within the practical operation range of optical devices for communication.

Figure 12:
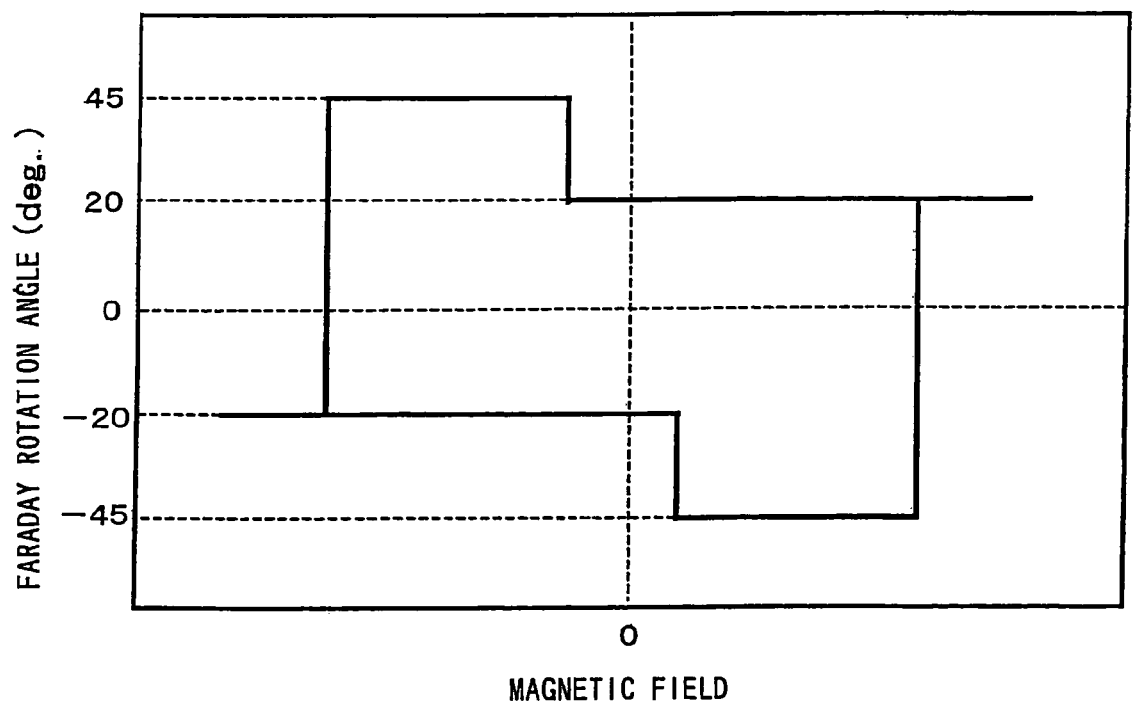
FIG. 12 is a graph showing the magnetic hysteresis of the Faraday rotation angle of a Faraday rotator formed of a conventional, hard magnetic, Bi-substituted rare earth-iron-garnet single-crystal film.

However, when hard magnetic, Bi-substituted rare earth-iron-garnet single-crystal film is planned and produced according to the method mentioned above, it has been found that the film shows a specific phenomenon (split) of giving multiple Faraday rotation angles under temperatures at which the spontaneous magnetization M of the film could be extremely reduced. FIG. 12 shows a magnetic hysteresis of the Faraday rotation angle of a Faraday rotator formed of the above-mentioned, hard magnetic garnet single-crystal film. Its horizontal axis shows a magnetic field, and its vertical axis shows a Faraday rotation angle (degree). As in FIG. 12, the Faraday rotator has two Faraday rotation angles of 45 degrees and 20 degrees. The Faraday rotator thus having the split is unfavorable since its Faraday rotation angle reproducibility is low and, in addition, its Faraday rotation angle significantly fluctuates depending on the varying external magnetic field and temperature. As a result, the Faraday rotator could not stably give the desired Faraday rotation angle. In particular, it has been confirmed that the Faraday rotation angle reproducibility of the Faraday rotator of the type lowers with temperature change. If such Faraday rotator is used in fabricating optical devices such as optical isolators, the resulting devices will have a problem of light transmission failure owing to the Faraday rotation angle fluctuation.

An attempt has been made for solving the above-mentioned problem, which comprises shifting the temperature range of split so as to fall outside the operation temperature range, from −40 to 85° C. of optical devices. In this case, however, the film becomes hard magnetic when its spontaneous magnetization M is relatively large, and its coercive force Hc is therefore extremely small. Accordingly, the film has a problem in that the magnetic characteristics of the Faraday rotator formed of the film are readily changed by the external magnetic field, temperature change and shock applied thereto, and the Faraday rotation angle thereof fluctuates. For these reasons, hard magnetic Faraday rotators are not as yet popularized in ordinary optical devices.

An object of this embodiment is to provide a Faraday rotator having good magnetic properties and to provide an optical device that comprises it.

The object is attained by a Faraday rotator that comprises a hard magnetic, Bi-substituted rare earth-iron-garnet single-crystal film and two surfaces formed on the single-crystal film for light transmission through them, in which the single-crystal film is represented by a chemical formula:

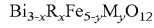

$Bi_{3-x}R_xFe_{5-y}M_yO_{12}$ wherein R is at least one element selected from rare earth elements including Y, and at least one element selected from Pb and Ca; x satisfies $1.5<x<2.5$; M is at least one element selected from Ga, Al, Sc, In, Si, Ge, Ti, Pt and Mg; and y satisfies $0<y<1.5$, and, when y in one of the two surfaces is represented by $y_1$ and y in the other is represented by $y_2$, then $y_1$ and $y_2$ satisfy $y_2 \leq y_1 \leq 2y_2$.

In the Faraday rotator of this embodiment, $y_1$ and $y_2$ preferably satisfy $y_1 \cong y_2$.

In the Faraday rotator of this embodiment, y preferably satisfies $0<y<0.1$.

In the Faraday rotator of this embodiment, M is preferably at least one element selected from Ga, Al, Sc, In, Si, Ge, Ti and Mg, not containing Pt.

The Faraday rotator of this embodiment preferably has a compensation temperature falling between −40° C. and 85° C.

The above-mentioned object of this embodiment is also attained by an optical device that comprises multiple optical elements, in which at least one optical element is the Faraday rotator of this embodiment.

The Faraday rotator and the optical device comprising it of this embodiment are described. First described is the principle of the Faraday rotator of this embodiment.

In case where the magnetic characteristics of a Faraday rotator are everywhere uniform, the rotator should not naturally cause a split even though its spontaneous magnetization M is extremely small at around its compensation temperature. Therefore, the split, if occurred, will be because the Faraday rotator comprises a laminate of multiple layers having different magnetic characteristics. We, the present inventors have analyzed the magnetic characteristics and the composition of Faraday rotator in various methods, and, as a result, have found that there is an obvious relationship between the composition distribution of iron and iron-substitutable elements and the split occurrence. Specifically, we have confirmed that, when the composition distribution of iron and iron-substitutable elements of Faraday rotator is non-uniform in the epitaxial film growth direction (light entering and going out direction), then the Faraday rotator has a split.

Figure 13:
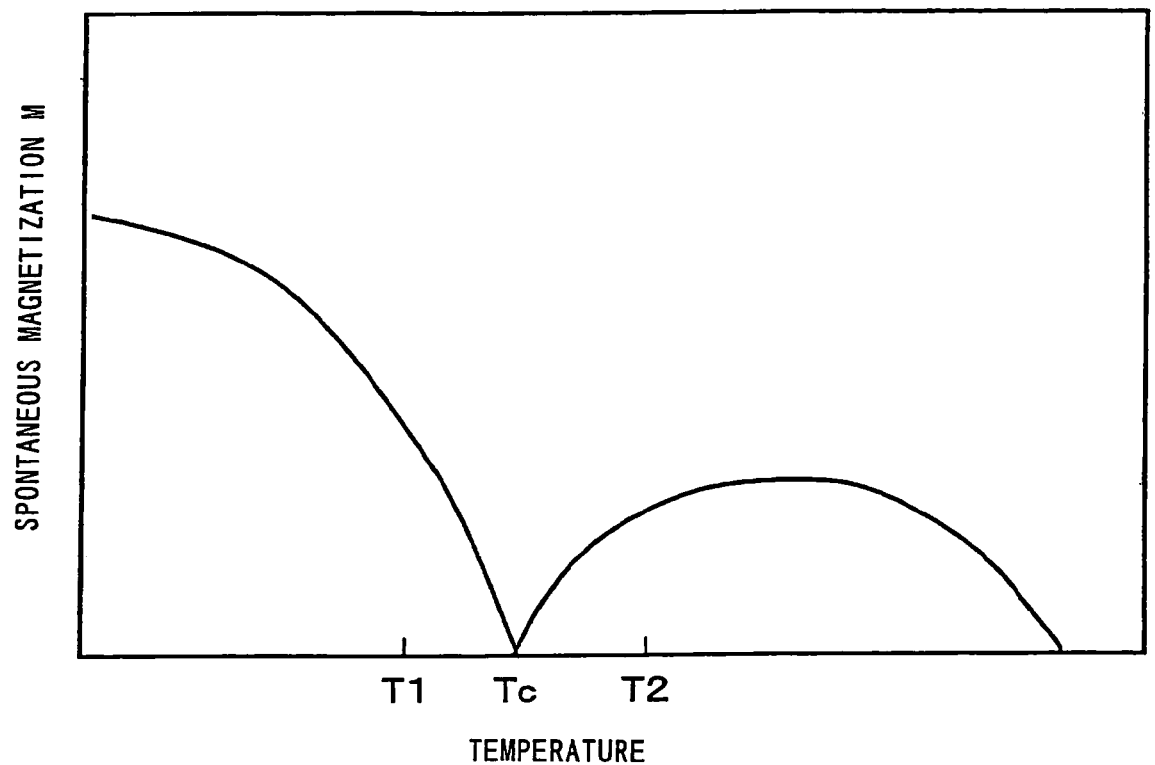
FIG. 13 is a graph showing the relationship between the spontaneous magnetization M and the temperature of a Faraday rotator formed of a hard magnetic, Bi-substituted rare earth-iron-garnet single-crystal film.

FIG. 13 shows the relationship between the spontaneous magnetization M of a Faraday rotator formed of a hard magnetic, Bi-substituted rare earth-iron-garnet single-crystal film, and the temperature thereof. The horizontal axis indicates the ambient temperature; and the vertical axis indicates the spontaneous magnetization M. As in FIG. 13, the spontaneous magnetization M is almost 0 at the compensation temperature Tc. The compensation temperature Tc is so controlled that it falls within a range between −40° C. and 85° C. that is needed for operation temperatures of optical devices.

Figure 14:
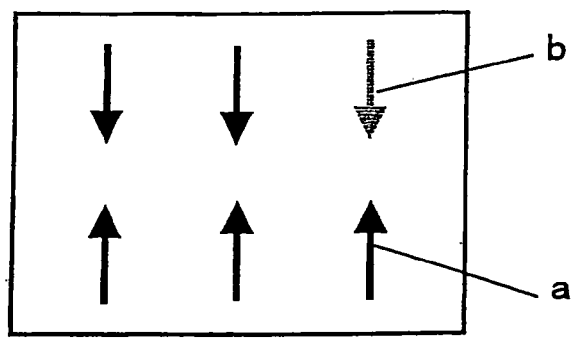
FIG. 14 is a view schematically showing the spin orientation of a Bi-substituted rare earth-iron-garnet single-crystal film at around the compensation temperature Tc thereof.
Figure 15:
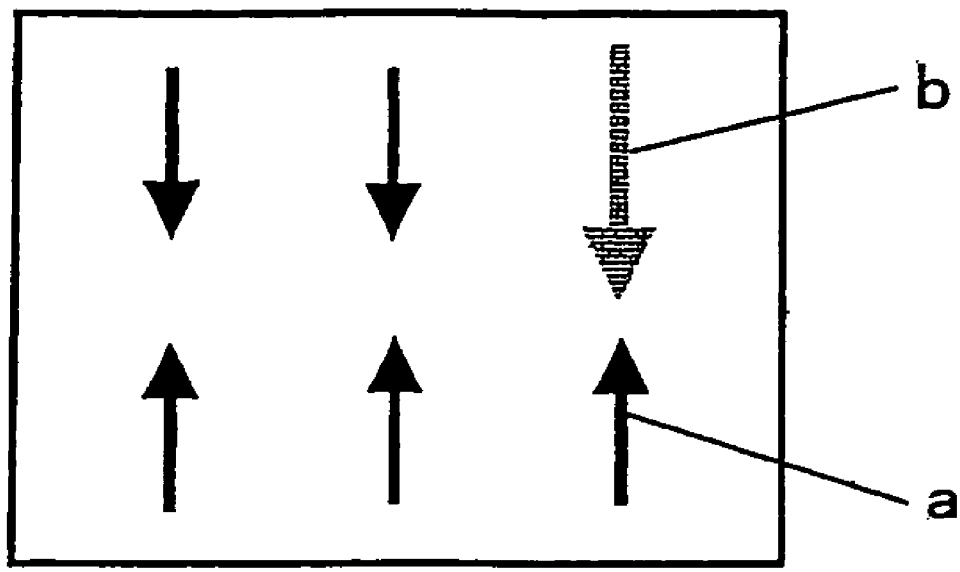
FIG. 15 is a view schematically showing the spin orientation of a Bi-substituted rare earth-iron-garnet single-crystal film at a temperature T2 higher than the compensation temperature Tc thereof.
Figure 16:
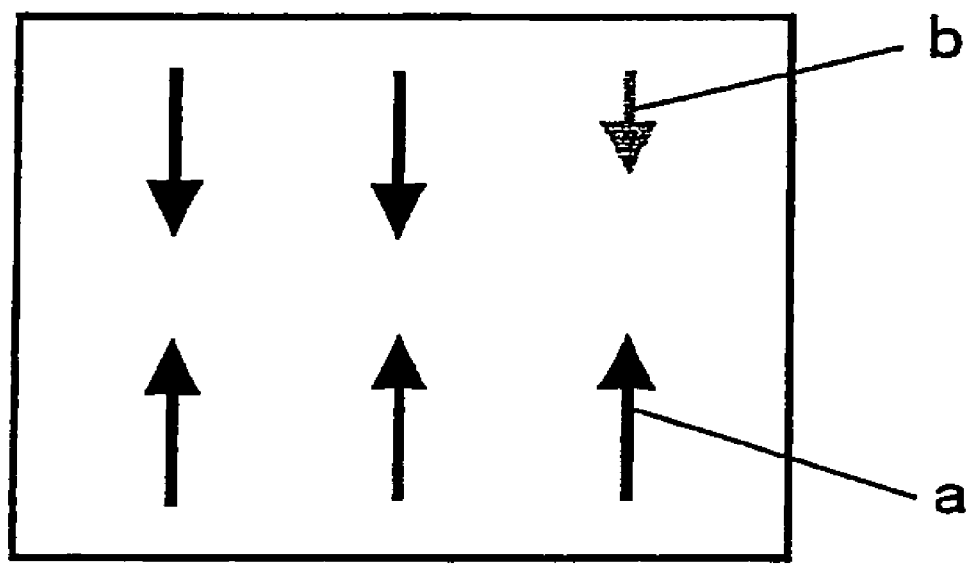
FIG. 16 is a view schematically showing the spin orientation of a Bi-substituted rare earth-iron-garnet single-crystal film at a temperature T1 lower than the compensation temperature Tc thereof.

FIG. 14 to FIG. 16 each schematically show the spin orientation of a Bi-substituted rare earth-iron-garnet single-crystal film. FIG. 14 shows the spin orientation at around the compensation temperature Tc of the film; FIG. 15 shows it at a temperature T2 higher than the compensation temperature Tc; and FIG. 16 shows it at a temperature T1 lower than the compensation temperature Tc. In these drawings, the arrow a shows the orientation and the intensity of the magnetic moment of iron ions; and the arrow b shows the orientation and the intensity of the magnetic moment of rare earth element ions. As in FIG. 14, the intensity of the magnetic moment of rare earth element ions is almost the same as that of iron ions at around the compensation temperature Tc. However, as in FIG. 15, the intensity of the magnetic moment of rare earth element ions is higher than that of iron ions at a temperature T2 higher than the compensation temperature Tc. On the other hand, as in FIG. 16, the intensity of the magnetic moment of iron ions is higher than that of rare earth element ions at a temperature T1 lower than the compensation temperature Tc.

Of the Bi-substituted rare earth-iron-garnet single-crystal film that contains a large amount of a rare earth element having a large magnetic moment, the compensation temperature Tc increases with increase in the amount of the non-magnetic element that substitutes for iron. When the degree of substitution with the non-magnetic element in the film is controlled to a suitable one, then the compensation temperature Tc of the film could be around room temperature, and the film may have a large coercive force Hc at the operation temperature of optical devices that is around room temperature.

On the other hand, if the degree of substitution with the non-magnetic element is not uniform in some regions of the film, the film shall have a different compensation temperature Tc in a different region even under the same temperature condition. As a result, the intensity of the magnetic moment of iron ions and that of rare earth element ions relative to the compensation temperature Tc differ in different regions of the film. Even when the intensity of the magnetic moment of rare earth element ions is almost the same as that of iron ions in some region of the film, the compensation temperature Tc shall be low in the other region having a larger iron composition ratio than that region, and the intensity of the magnetic moment of iron ions shall be higher than that of rare earth element ions in that other region. Contrary to this, in the region having a smaller ion composition ratio, the intensity of the magnetic moment of rare earth element ions shall be higher than that of iron ions. This means that one Faraday rotator inevitably has multiple regions that differ from each other in the sum of the magnetic moment of iron ions and that of rare earth element ions. These multiple regions have different magnetic characteristics.

Figure 17A:
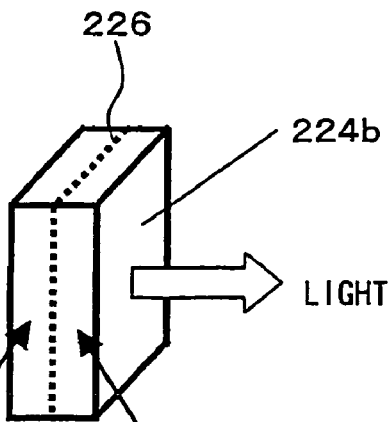
FIG. 17A to FIG. 17E are views schematically showing the constitution of a Faraday rotator which has two regions where the sum of the magnetic moments of iron ions and rare earth element ions differs from each other, and the magnetic characteristics of each region.
Figure 17B:
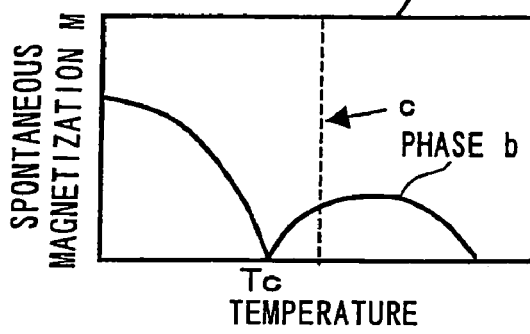
Figure 17C:
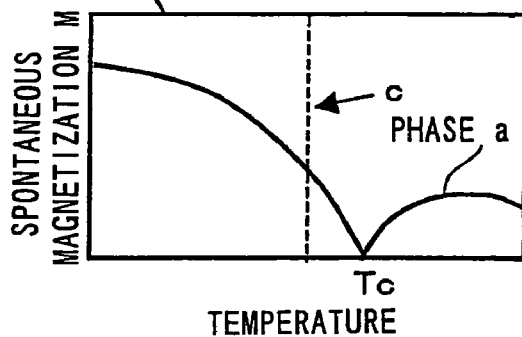
Figure 17D:
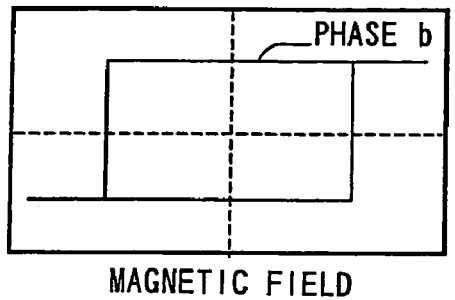
Figure 17E:
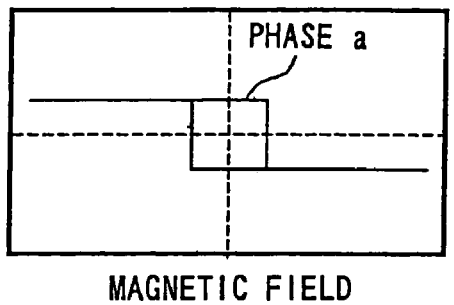

FIG. 17A to FIG. 17E schematically show the constitution of a Faraday rotator which has two regions where the sum of the magnetic moments of iron ions and rare earth element ions differs from each other, and the magnetic characteristics of each region. As in FIG. 17A, the Faraday rotator 224b has two regions that differ in point of the sum of the magnetic moments of iron ions and rare earth element ions. The two regions are adjacent to each other via a virtual face 226 that is almost parallel to the two opposite faces of the rotator via which light enters and goes out of the rotator. FIG. 17B shows the relationship between the spontaneous magnetization M and the temperature of the light-receiving side (phase b) of the Faraday rotator 224b; and FIG. 17C shows the relationship between the spontaneous magnetization M and the temperature of the light-emitting side (phase a) of the Faraday rotator 224b. In FIG. 17B and FIG. 17C, the horizontal axis indicates the ambient temperature, and the vertical axis indicates the spontaneous magnetization M. The dotted line c indicates the temperature of the Faraday rotator 224b. FIG. 17D shows the magnetic hysteresis of the phase b of the Faraday rotator 224b; and FIG. 17E shows the magnetic hysteresis of the phase a of the Faraday rotator 224b. In FIG. 17D and FIG. 17E, the horizontal axis indicates the magnetic field, and the vertical axis indicates the Faraday rotation angle. In FIG. 17D and FIG. 17E, the dotted line extending in the horizontal direction indicates the Faraday rotation angle of degree; and the dotted line extending in the vertical direction indicates the magnetic field of 0.

As in FIG. 17B and FIG. 17C, the phase a differs from the phase b in point of the compensation temperature Tc thereof. The compensation temperature Tc of the phase a is higher than the temperature of the Faraday rotator 224b; and the compensation temperature Tc of the phase b is lower than the temperature of the Faraday rotator 224b. Accordingly, as in FIG. 17D and FIG. 17E, the phase a differs from the phase b in point of the magnetic hysteresis thereof. As a result, the magnetic hysteresis of the Faraday rotator 224b shall be the sum of the magnetic hysteresis of the phase a and that of the phase b; and the Faraday rotation angle of the rotator shall a split at a temperature around the compensation temperature Tc thereof, as in FIG. 12.

The iron composition distribution fluctuation in Bi-substituted rare earth-iron-garnet single-crystal film results from the composition fluctuation of the element that substitutes for iron during the epitaxial growth of the film. Having noted it, we the present inventors analyzed the film for the type of the element that has substituted for iron and for the degree of substitute element composition fluctuation, and, as a result, have found that, when the substitute element composition fluctuation is retarded more highly, then the split can be prevented more effectively and the coercive force Hc of the film increases more.

Ga and Al are much used for non-magnetic elements that substitute for iron in Bi-substituted rare earth-iron-garnet single-crystal film, since they stabilize the epitaxial growth of the film and since their ionic valence is the same as that of iron, or that is, their ions are trivalent like iron ions. Accordingly, the composition distribution of the non-magnetic elements such as Ga and Al that are much used in the film must be uniform. Regarding Ga and Al, however, the film-growing condition shall be naturally determined depending on the proportion of their oxides to be put into the film-growing crucible along with iron oxide. Therefore, the possibility that the Ga and Al composition will be non-uniform in each region of Faraday rotator is low. Accordingly, the Ga and Al composition fluctuation does not have any significant influence on the split occurrence under ordinary epitaxial growth condition.

As other non-magnetic elements, there are mentioned non-magnetic minor substitute elements which dissolve out of crucibles and tools into flux and which substitute for iron in the films formed. Since the minor substitute elements are not the starting materials for film growth, the amount of their composition that may be in the Bi-substituted rare earth-iron-garnet single-crystal films formed will be at most 0.1 or so. However, we, the present inventors have found that the composition distribution of these minor substitute elements has a significant influence on the split occurrence. Specifically, when the composition distribution of the non-magnetic minor elements that substitute for iron in the films is not uniform, then the split occurrence in the films formed is inevitable. Accordingly, for improving the characteristic of the coercive force Hc of Faraday rotator, we have found that the composition distribution of the minor substitute elements must be unified. Most preferably, the composition distribution of the minor substitute elements is almost uniform in the direction in which the films have grown (in the direction of the thickness of the films), or that is, the amount of the non-magnetic element that has substituted for iron is the same as that of iron between the two surfaces of Bi-substituted rare earth-iron-garnet single-crystal film of Faraday rotator through which light enters and goes out of the rotator. However, even through the composition distribution is not uniform, it does not always have any negative influence on the practical characteristics of Faraday rotator. When the amount of each non-magnetic element in one surface of the two surfaces of Bi-substituted rare earth-iron-garnet single-crystal film of Faraday rotator through which light enters and goes out of the rotator is not smaller than that in the other surface thereof and when the former is two times or less the latter, then the split is prevented and the coercive force Hc of the Faraday rotator may be on the practical level.

One typical example of the non-magnetic minor substitute elements, which dissolve out of crucibles and tools into flux and which substitute for iron, is Pt. In general, the containers to receive the starting materials for epitaxial growth into garnet single-crystal films are essentially formed of Pt (having a melting point of 1772° C.) as its reactivity with the flux of PbO, $Bi_2O_3$ and $B_2O_3$ is low and its melting point is much higher than the film-growing temperature. Though its reactivity is low, Pt may react with flux in some degree, and will therefore gradually dissolve in flux during epitaxial growth to give the intended film. Accordingly, Pt must be specifically so controlled that the amount of Pt in one surface of the two surfaces of Bi-substituted rare earth-iron-garnet single-crystal film of Faraday rotator through which light enters and goes out of the rotator is not smaller than that in the other surface thereof and the former is two times or less the latter.

In addition, impurities other than Pt may dissolve out of crucibles and other tools used for substrate fixation into flux, and they may enter the epitaxially-grown film to form some uneven composition distribution therein. Even in such a case, the amount of each non-magnetic element in one surface of the two surfaces of Bi-substituted rare earth-iron-garnet single-crystal film of Faraday rotator through which light enters and goes out of the rotator must not be smaller than that in the other surface thereof and the former must be two times or less the latter.

For further improving the Hc characteristic of Faraday rotator, we, the present inventors have investigated the use of Au for forming crucibles, stirring tools (stirrers) that are to stir flux, and fixers for substrate fixation, and tried them in growing epitaxial films. Au is an element that is extremely hardly ionized, and therefore dissolves little in the flux of PbO, $Bi_2O_3$ and $B_2O_3$, and, in addition, even a slight amount of Au having dissolved therein deposits little on the epitaxial film of oxides. Accordingly, for removing Pt and other impurities that may dissolve out of crucibles and tools and may deposit in the films formed, the measures to use Au may be the most effective. Removing Pt and other impurities from the films in that manner realizes ideal hard magnetic Faraday rotators which have an increased coercive force Hc and have no split.

However, the melting point of Au is 1064° C. and is near to the film-growing temperature. Therefore, crucibles and tools formed of Au may soften at the film-growing temperature and will be difficult to handle. To solve the problem, a reinforced material of Pt—Au alloy will be effective for increasing the strength of crucibles and tools. The material of the type will release a minor amount of Pt, which may enter epitaxial films. Even in such a case, we have confirmed the absence of any practical problem so far as the amount of Pt in one surface of the two surfaces of Bi-substituted rare earth-iron-garnet single-crystal film of Faraday rotator through which light enters and goes out of the rotator is smaller than that in the other surface thereof and the former is two times or less the latter.

Regarding the other non-magnetic elements such as Ga and Al in the starting material composition, which are much substitute for iron in the films formed, it is also ideal that their composition in the films does not fluctuate. The requirement that the amount of each non-magnetic element in one surface of the two surfaces of Faraday rotator is smaller than that in the other surface thereof and the former is two times or less the latter also applies to hard magnetic Faraday rotators.

As in the above, the Faraday rotator of this embodiment comprises a Bi-substituted rare earth-iron-garnet single-crystal film of a chemical formula:

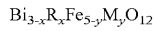

$Bi_{3-x}R_xFe_{5-y}M_yO_{12}$ wherein R is at least one element selected from rare earth elements including Y, and at least one element selected from Pb and Ca; x satisfies 1.5<x<2.5; M is at least one element selected from Ga, Al, Sc, In, Si, Ge, Ti, Pt and Mg; and y satisfies 0<y<1.5.

The Faraday rotator of this embodiment is formed on the Bi-substituted rare earth-iron-garnet single-crystal film, and when y in one of the two surfaces thereof through which light enters and goes out of the rotator is represented by $y_1$ and y in the other is represented by $y_2$, then $y_1$ and $y_2$ satisfy $y_2 \leq y_1 \leq 2y_2$. More preferably, $y_1$ and $y_2$ satisfy $y_1 \cong y_2$.

Figure 18:
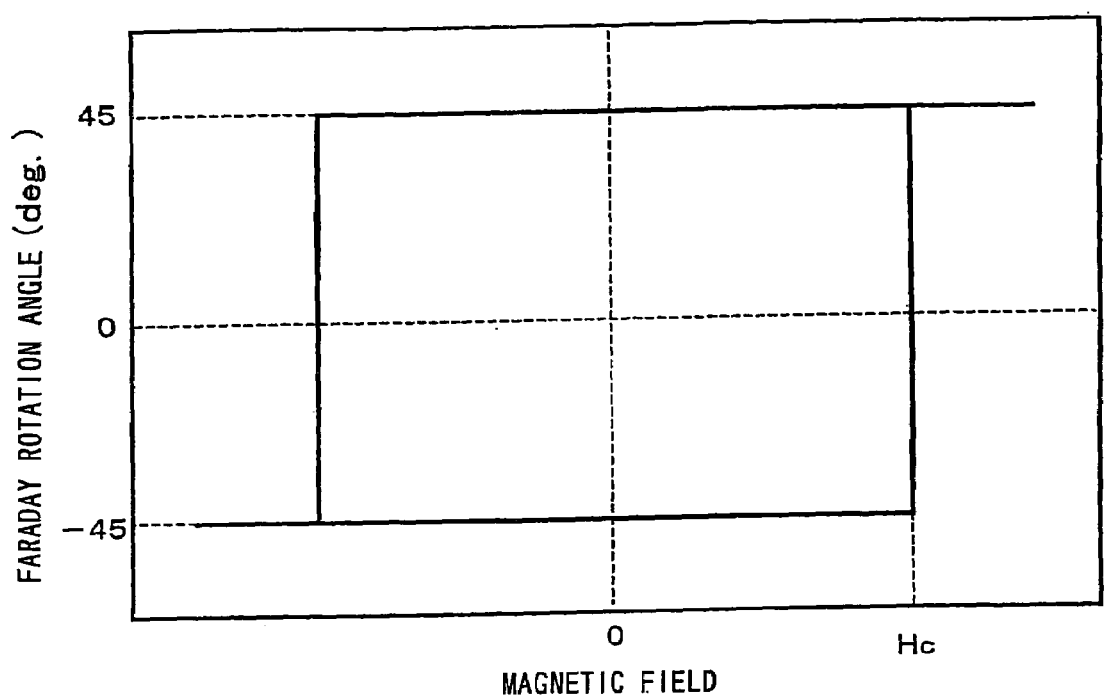
FIG. 18 is a graph showing the magnetic hysteresis of the Faraday rotation angle of the Faraday rotator of the third embodiment of the invention.

FIG. 18 shows the magnetic hysteresis (hard magnetic characteristic) of the Faraday rotation angle of the Faraday rotator of this embodiment. The horizontal axis indicates a magnetic field and the vertical axis indicates a Faraday rotation angle (degree). As in FIG. 18, no split occurs in the Faraday rotator of this embodiment, and the rotator has a relatively large coercive force Hc and a good square hysteresis profile. As already described herein above with reference to FIG. 4 to FIG. 6, the Faraday rotator of this embodiment is usable in optical devices and optical communication systems.

In this embodiment, the composition distribution in the light-transmitting direction of each non-magnetic element that substitutes for iron in hard magnetic, Bi-substituted rare earth-iron-garnet single-crystal film is controlled to fall within a predetermined range, and the Faraday rotator of this embodiment that is formed of the thus-controlled single-crystal film does not have a split.

The Faraday rotator of this embodiment is described with reference to the following concrete Examples.

EXAMPLE 3-1

$Tb_4O_7$, $Yb_2O_3$, $Bi_2O$, $Fe_2O_3$, $Ga_2O_3$, $GeO_2$, PbO and $B_2O_3$ were put into an Au crucible, and the crucible was set in an electric furnace. Heated therein, the components were melted and then stirred. A CaMgZr-substituted gadolinium-gallium-garnet single-crystal substrate was fixed with an Au fixer, and a Bi-substituted rare earth-iron-garnet single-crystal film having a composition of $(BiTbYbPb)_3(FeGaGe)_5O_{12}$ was grown from the melt on the substrate through LPE. This garnet single-crystal film was polished and cut, and its two light-transmitting faces were coated with an antireflection film. This gave a Faraday rotator having a size of 1.5 mm×1.5 mm and a thickness of 450 μm and having a Faraday rotation angle of 45 degrees at a wavelength of 1.55 μm. Tested with VSM, the compensation temperature of this Faraday rotator was 15° C. At varying temperatures, this was tested with VSM to measure its spontaneous magnetization M. The temperature at which the spontaneous magnetization M of the rotator was nearest to 0 at lower than the Curie point thereof was determined as the compensation temperature of the rotator. At 25° C., the Faraday rotator was analyzed for the relationship between the Faraday rotation angle thereof and the external magnetic field applied thereto. As a result, the Faraday rotation angle of the rotator was 45 degrees alone with no split, and the coercive force Hc thereof was 500 kA/m. Next, the Faraday rotator was analyzed for the garnet composition in its two faces of receiving and emitting light. The composition analysis was effected for Ga and Ge through laser ablation/ICP mass spectrometry of the two light-transmitting faces of $(BiTbYbPb)_3(FeGaGe)_5O_{12}$ single crystal of the Faraday rotator. The analyzed data were relatively compared with each other, and the compositional ratio of the constitutive elements in the light-transmitting two faces was determined. As a result, the compositional ratio of the constitutive elements in the light-transmitting two faces of the Faraday rotator was as follows: Based on the standardized amount, 100, of Ga and Ge in one surface of the rotator, the relative amount of Ga and Ge in the other surface thereof was 110 each.

EXAMPLE 3-2

$Tb_4O_7$, $Yb_2O_3$, $Bi_2O$, $Fe_2O_3$, $Ga_2O_3$, $GeO_2$, PbO and $B_2O_3$ were put into an Au crucible, and the crucible was set in an electric furnace. Heated therein, the components were melted and then stirred. A CaMgZr-substituted gadolinium-gallium-garnet single-crystal substrate was fixed with a Pt fixer, and a Bi-substituted rare earth-iron-garnet single-crystal film having a composition of $(BiTbYbPb)_3(FeGaGePt)_5O_{12}$ was grown from the melt on the substrate through LPE. This garnet single-crystal film was polished and cut, and its two light-transmitting faces were coated with an antireflection film. This gave a Faraday rotator having a size of 1.5 mm×1.5 mm and a thickness of 450 μm and having a Faraday rotation angle of 45 degrees at a wavelength of 1.55 μm. Tested with VSM, the compensation temperature of this Faraday rotator was 15° C. At varying temperatures, this was tested with VSM to measure its spontaneous magnetization M. The temperature at which the spontaneous magnetization M of the rotator was nearest to 0 at lower than the Curie point thereof was determined as the compensation temperature of the rotator. At 25° C., the Faraday rotator was analyzed for the relationship between the Faraday rotation angle thereof and the external magnetic field applied thereto. As a result, the Faraday rotation angle of the rotator was 45 degrees with a minor split, and the coercive force Hc thereof was 200 kA/m. Next, the Faraday rotator was analyzed for the garnet composition in its two faces of receiving and emitting light. The composition analysis was effected for Ga, Ge and Pt through laser ablation/ICP mass spectrometry of the two light-transmitting faces of $(BiTbYbPb)_3(FeGaGePt)_5O_{12}$ single crystal of the Faraday rotator. The analyzed data were relatively compared with each other, and the compositional ratio of the constitutive elements in the light-transmitting two faces was determined. As a result, the compositional ratio of the constitutive elements in the light-transmitting two faces of the Faraday rotator was as follows: Based on the standardized amount, 100, of Ga, Ge and Pt in one surface of the rotator, the relative amount of Ga in the other surface thereof was 100, that of Ge was 110, and that of Pt was 150.

EXAMPLE 3-3

$Tb_4O_7$, $Yb_2O_3$, $Bi_2O$, $Fe_2O_3$, $Ga_2O_3$, $GeO_2$, PbO and $B_2O_3$ were put into an Au—Pt alloy crucible, and the crucible was set in an electric furnace. Heated therein, the components were melted and then stirred. A CaMgZr-substituted gadolinium-gallium-garnet single-crystal substrate was fixed with a Pt fixer, and a Bi-substituted rare earth-iron-garnet single-crystal film having a composition of $(BiTbYbPb)_3(FeGaGePt)_5O_{12}$ was grown from the melt on the substrate through LPE. This garnet single-crystal film was polished and cut, and its two light-transmitting faces were coated with an antireflection film. This gave a Faraday rotator having a size of 1.5 mm×1.5 mm and a thickness of 450 μm and having a Faraday rotation angle of 45 degrees at a wavelength of 1.55 μm. Tested with VSM, the compensation temperature of this Faraday rotator was 15° C. At varying temperatures, this was tested with VSM to measure its spontaneous magnetization M. The temperature at which the spontaneous magnetization M of the rotator was nearest to 0 at lower than the Curie point thereof was determined as the compensation temperature of the rotator. At 25° C., the Faraday rotator was analyzed for the relationship between the Faraday rotation angle thereof and the external magnetic field applied thereto. As a result, the Faraday rotation angle of the rotator was 45 degrees with a split, and the coercive force Hc thereof was 120 kA/m. The level of coercive force Hc of 120 kA/m is acceptable for practical use with no problem. Next, the Faraday rotator was analyzed for the garnet composition in its two faces of receiving and emitting light. The composition analysis was effected for Ga, Ge and Pt through laser ablation/ICP mass spectrometry of the two light-transmitting faces of $(BiTbYbPb)_3(FeGaGePt)_5O_{12}$ single crystal of the Faraday rotator. The analyzed data were relatively compared with each other, and the compositional ratio of the constitutive elements in the light-transmitting two faces was determined. As a result, the compositional ratio of the constitutive elements in the light-transmitting two faces of the Faraday rotator was as follows: Based on the standardized amount, 100, of Ga, Ge and Pt in one surface of the rotator, the relative amount of Ga in the other surface thereof was 100, that of Ge was 100, and that of Pt was 200.

COMPARATIVE EXAMPLE 3-1

$Tb_4O_7$, $Yb_2O_3$, $Bi_2O$, $Fe_2O_3$, $Ga_2O_3$, $GeO_2$, PbO and $B_2O_3$ were put into a Pt crucible, and the crucible was set in an electric furnace. Heated therein, the components were melted and then stirred. A CaMgZr-substituted gadolinium-gallium-garnet single-crystal substrate was fixed with a Pt fixer, and a Bi-substituted rare earth-iron-garnet single-crystal film having a composition of $(BiTbYbPb)_3(FeGaGePt)_5O_{12}$ was grown from the melt on the substrate through LPE. This garnet single-crystal film was polished and cut, and its two light-transmitting faces were coated with an antireflection film. This gave a Faraday rotator having a size of 1.5 mm×1.5 mm and a thickness of 450 μm and having a Faraday rotation angle of 45 degrees at a wavelength of 1.55 μm. Tested with VSM, the compensation temperature of this Faraday rotator was 15° C. At varying temperatures, this was tested with VSM to measure its spontaneous magnetization M. The temperature at which the spontaneous magnetization M of the rotator was nearest to 0 at lower than the Curie point thereof was determined as the compensation temperature of the rotator. At 25° C., the Faraday rotator was analyzed for the relationship between the Faraday rotation angle thereof and the external magnetic field applied thereto. As a result, the Faraday rotation angle of the rotator was 45 degrees with a split, and the coercive force Hc thereof was 10 kA/m. This Faraday rotator is unsuitable to practical use. Next, the Faraday rotator was analyzed for the garnet composition in its two faces of receiving and emitting light. The composition analysis was effected for Ga, Ge and Pt through laser ablation/ICP mass spectrometry of the two light-transmitting faces of $(BiTbYbPb)_3(FeGaGePt)_5O_{12}$ single crystal of the Faraday rotator. The analyzed data were relatively compared with each other, and the compositional ratio of the constitutive elements in the light-transmitting two faces was determined. As a result, the compositional ratio of the constitutive elements in the light-transmitting two faces of the Faraday rotator was as follows: Based on the standardized amount, 100, of Ga, Ge and Pt in one surface of the rotator, the relative amount of Ga in the other surface thereof was 110, that of Ge was 90, and that of Pt was 250.

In this embodiment, the composition distribution in the light-transmitting direction of each non-magnetic element that substitutes for iron in hard magnetic, Bi-substituted rare earth-iron-garnet single-crystal film is controlled to fall within a predetermined range, and the Faraday rotator of this embodiment that is formed of the thus-controlled single-crystal film have a relatively large coercive force Hc, not having a split. Accordingly, the Faraday rotator of this embodiment is free from the problem with conventional rotators of which the Faraday rotation angle often fluctuates even with minor change in the external magnetic field, or with minor heat or vibration applied thereto.

As described herein above, this embodiment realizes a Faraday rotator having good magnetic characteristics and an optical device that comprises it.

Fourth Embodiment of the Invention

Next described is the Faraday rotator and the optical device of the fourth embodiment of the invention with reference to FIG. 19 to FIG. 21B. The communication market is expanding these days, and it is much desired to reduce the costs of optical communication systems. Many optical devices for communication such as optical isolators are used in optical communication systems. For reducing the costs of optical communication systems, it is effective to reduce the number of optical devices to be used in the systems. Given that situation, it is desired to reduce as much as possible the insertion loss in optical devices to thereby expand the range of light that passes through optical fibers. This is for reducing the number of optical devices to be used in optical communication systems. For this, it is desired to reduce the insertion loss in Faraday rotators that are used in optical devices.

Insertion loss in Faraday rotators will be caused by the following three factors. The first factor is the light absorption intrinsic to the elements that constitute the Bi-substituted rare earth-iron-garnet single crystal films to form Faraday rotators. The second factor is the light absorption to be caused by the breakdown of the charge balance of all ions that constitute the garnet single-crystal films. The third factor is the unfavorable characteristic of the antireflection film to be formed on the light-transmitting faces of the garnet single-crystal films. Solution of the problems with these factors enables the reduction in the insertion loss in Faraday rotators.

Bi and Fe that are the essential constitutive elements of Bi-substituted rare earth-iron-garnet single crystal films do not absorb light falling within a wavelength range of from 1.3 to 1.6 µm. Therefore, when Gd, Ho, Yb and the like that do not also absorb light falling within the wavelength range of from 1.3 to 1.6 µm are selected for the rare earth elements to constitute garnet single-crystal films, then the films will be free from the insertion loss to be caused by the absorption of light by the constitutive elements. On the other hand, when the structure and the thickness of the antireflection film to be formed on the light-transmitting faces of a Faraday rotator formed of a garnet single-crystal film are specifically determined in accordance with the refractive index of the material that forms the antireflection film, then the garnet single-crystal film of the Faraday rotator thus coated with the specific antireflection film may reflect little light falling within a specific wavelength range.

The cations that constitute Bi-substituted rare earth-iron-garnet single-crystal film are basically trivalent. When these cations become divalent or tetravalent, then the charge balance of the Bi-substituted rare earth-iron-garnet single-crystal film is broken, and it will cause light absorption of the film (for example, see JP-B 6-46604). For restoring the charge balance thereof, the garnet single-crystal film is subjected to heat treatment at a suitable temperature in a suitable atmosphere to thereby convert minor Pb ions in the garnet single-crystal film into $Pb^{2+}$ and $Pb^{4+}$, and the charge balance of the film is thereby restored by these divalent and tetravalent cations. On the other hand, in the garnet single-crystal film having grown in an atmosphere of air, the Pb ions are in the form of $Pb^{2+}$. Therefore, tetravalent cations of $Si^{4+}$, $Ti^{4+}$, $Ge^{4+}$ and $Pt^{4+}$ are added to the film to keep the charge balance of the film.

However, even though the above-mentioned conditions to minimize the insertion loss are defined, there still remains a problem that Faraday rotators with a satisfactorily reduced insertion loss could not be obtained. In fact, even a Faraday rotator with a smallest insertion loss undergoes an insertion loss of about 0.05 dB to light having a wavelength of 1.55 µm. For example, therefore, in a polarization-independent optical isolator that comprises two Faraday rotators, the optical loss increases by about 0.1 db owing to the insertion loss in the Faraday rotators therein.

An object of this embodiment is to provide a Faraday rotator with a more reduced insertion loss and an optical device that comprises it.

The object is attained by a Faraday rotator that comprises a Bi-substituted rare earth-iron-garnet single-crystal film and two surfaces formed on the single-crystal film for light transmission through them, in which the single-crystal film is represented by a chemical formula:

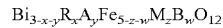

$$Bi_{3-x-y}R_xA_yFe_{5-z-w}M_zB_wO_{12}$$

wherein R is at least one element selected from rare earth elements including Y; A is at least one element selected from Pb, Ca and Cd; x and y satisfy 1.5<x+y<2.5; M is at least one element selected from Ga, Al, Sc and In; B is at least one element selected from Si, Ti, Ge, Pt and Mg; and z and w satisfy 0<z+w<1.5, and, when y in one of the two surfaces is represented by $y_1$ and y in the other is represented by $y_2$, then $y_1$ and $y_2$ satisfy $y_2 \leq y_1 \leq 2y_2$; and when w in one of the two surfaces is represented by $w_1$ and w in the other is represented by $w_2$, then $w_1$ and $w_2$ satisfy $w_2 \leq w_1 \leq 2w_2$.

In the Faraday rotator of this embodiment, $y_1$ and $y_2$ preferably satisfy $y_1 \cong y_2$, and $w_1$ and $w_2$ preferably satisfy $w_1 \cong w_2$.

In the Faraday rotator of this embodiment, y preferably satisfies 0<y<0.1, and w preferably satisfies 0≦w<0.1.

In the Faraday rotator of this embodiment, B is preferably at least one element selected from Si, Ti, Ge and Mg, not containing Pt.

The above-mentioned object of this embodiment is also attained by an optical device that comprises multiple optical elements, in which at least one optical element is the Faraday rotator of this embodiment.

The Faraday rotator and the optical device comprising it of this embodiment are described. First described is the principle of the Faraday rotator of this embodiment.

When the constitutive elements of Bi-substituted rare earth-iron-garnet single-crystal film are suitably selected and when the material and the structure of the antireflection film that covers the garnet single-crystal are optimized, then both the optical loss owing to the absorption of light by the constitutive elements and the optical loss owing to the reflection of light on the surfaces of the Faraday rotator formed of the antireflection film-coated garnet single-crystal film may be made almost 0. Having made these optical losses almost 0, we, the present inventors have further investigated the reason for the insertion loss in Faraday rotators. As a result, we have found that the reason is because the Bi-substituted rare earth-iron-garnet single-crystal film having grown through LPE could not always keep its charge balance.

Bi-substituted rare earth-iron-garnet single-crystal film in which almost all cations are trivalent can keep its charge balance when the amount of the divalent cations is equivalent to that of the tetravalent cations in the film. Typical divalent and tetravalent cations in the garnet single-crystal film are $Pb^{2+}$ and $Pt^{4+}$, respectively. Pb results from PbO that serves as a flux component in film formation, and deposits in the garnet single-crystal film formed. Pt dissolves out of Pt crucibles into flux, and deposits in the garnet single-crystal film formed.

However, we have found that Pt has a non-uniform composition distribution in the growth direction of the epitaxial film. Concretely, Pt gradually dissolves out into flux during the epitaxial growth of the film, and some of it deposits in the garnet single-crystal film formed. Accordingly, the Pt concentration in flux gradually increases during epitaxial growth of the film, and with it, the amount of Pt in the garnet single-crystal film formed therefore gradually increases. As a result, the element to give tetravalent cations is so distributed in the film that it gradually increases in the direction of the film growth.

On the other hand, the amount of PbO to be in flux is determined in accordance with the blend ratio of the starting material put into a crucible. Therefore, the amount of the divalent cations of $Pb^{2+}$ to be in the garnet single-crystal film during its epitaxial growth is constant. As a result, the element to give divalent cations is almost uniformly distributed in the direction of the film growth. In case where other elements than Pb that may be stabilized as divalent or tetravalent cations in the garnet single-crystal film are in the starting material, the amount of such elements to be in the garnet single-crystal film formed through epitaxial growth shall be also constant for the same reason as above.

Figure 19:
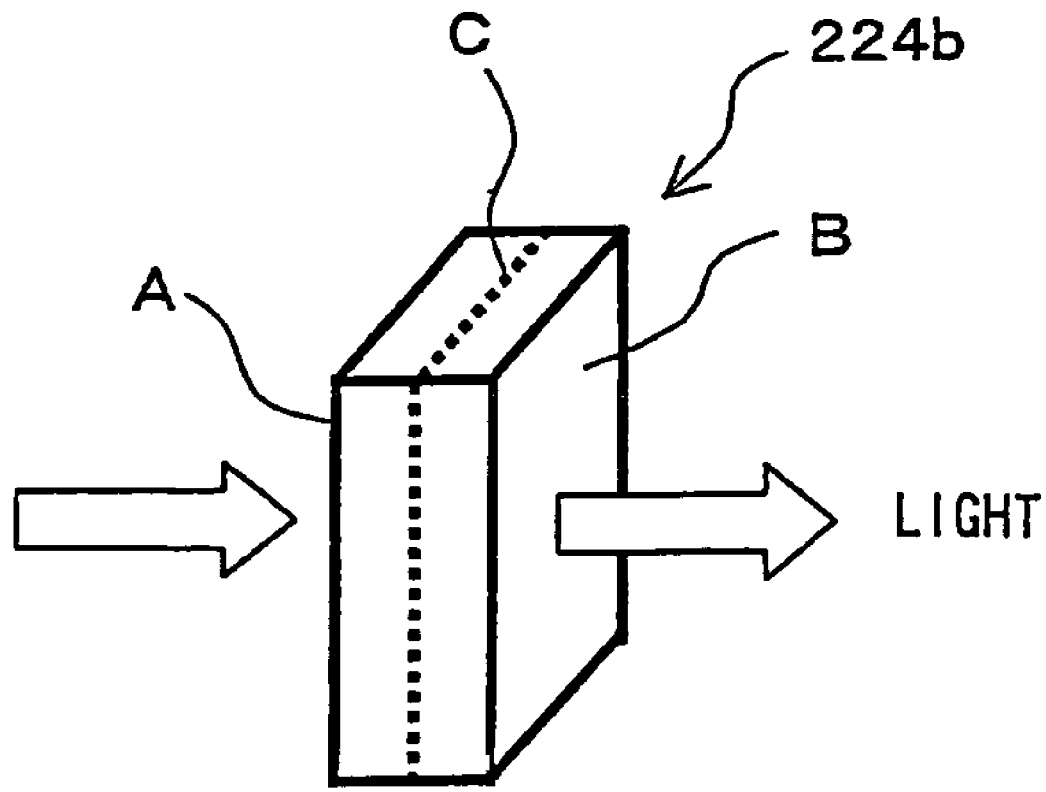
FIG. 19 is a view showing the outline constitution of a Faraday rotator and the direction in which light runs through the rotator.

FIG. 19 shows the outline of the structure of a Faraday rotator and the direction in which light travels through the rotator. As in FIG. 19, the Faraday rotator 224b comprises a tabular Bi-substituted rare earth-iron-garnet single-crystal film, and two surfaces A and B formed on the garnet single-crystal film, in which light travels through the two surfaces A and B. The surfaces A and B each are coated with an antireflection film (not shown). The direction of the film growth of the garnet single-crystal film is, for example, from the surface A to the surface B.

Figure 20A:
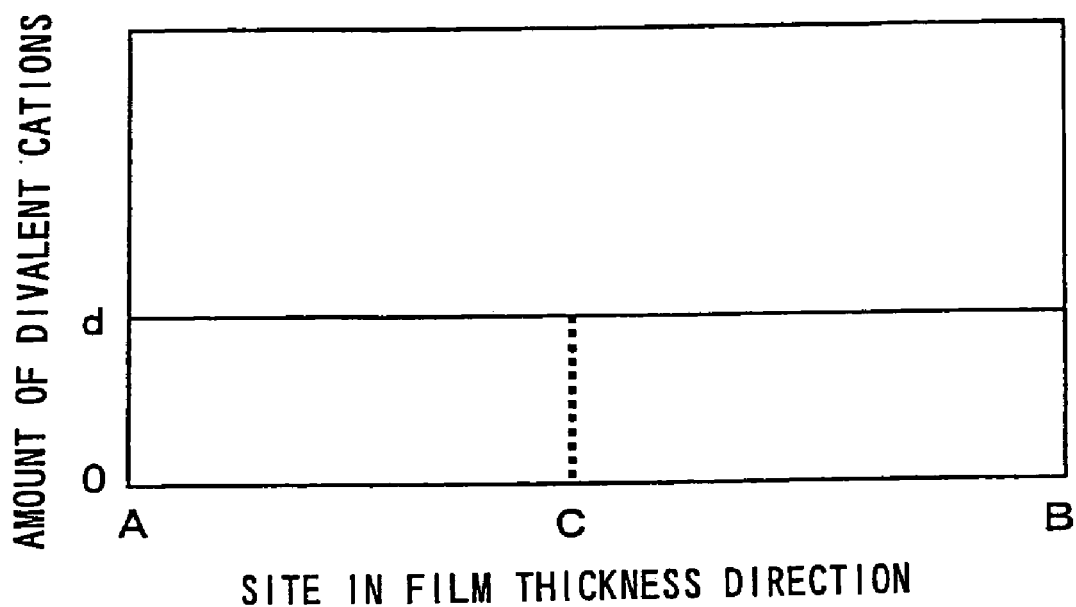
FIG. 20A and FIG. 20B are graphs each showing the distribution of the amount of divalent or tetravalent cations in the direction of the thickness of a Bi-substituted rare earth-iron-garnet single-crystal film for Faraday rotators.
Figure 20B:
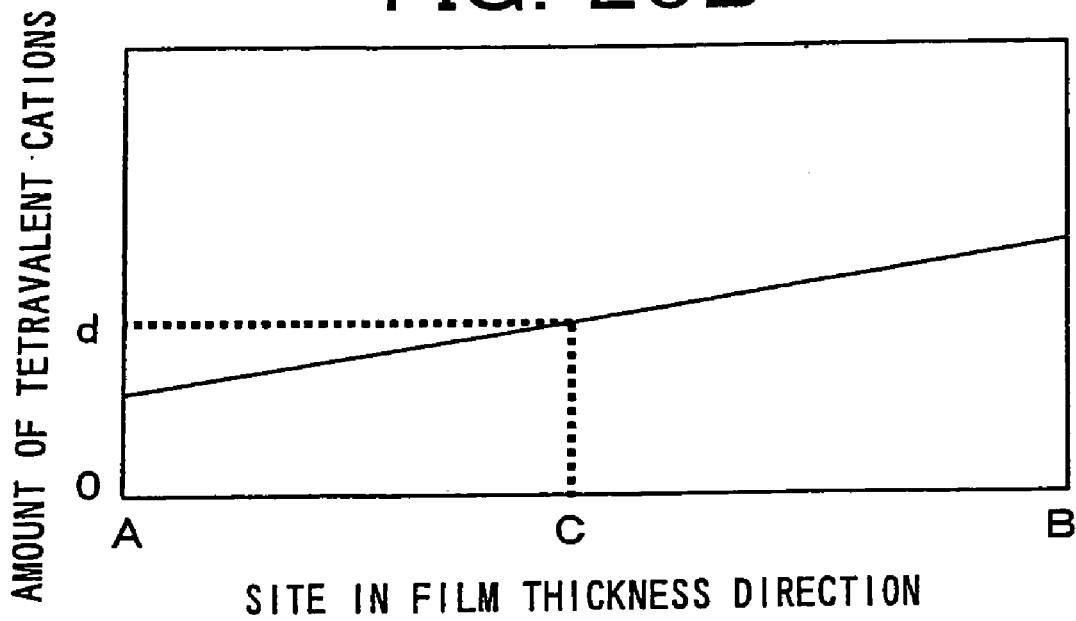

FIG. 20A is a graph showing the distribution of the amount of divalent cations in the direction of the thickness of the garnet single-crystal film of the Faraday rotator of FIG. 19. FIG. 20B is a graph showing the distribution of the amount of tetravalent cations in the direction of the thickness of the garnet single-crystal film of the Faraday rotator of FIG. 19. In FIG. 20A and FIG. 20B, the horizontal axis indicates a position in the direction of the film thickness. The left edge of the horizontal axis indicates the position of the surface A, and the right edge thereof indicates the position of the surface B. In FIG. 20A, the vertical axis indicates the amount of divalent cations; and in FIG. 20B, the vertical axis indicates the amount of tetravalent cations on the same scale as that of the vertical axis in FIG. 20A. As in FIG. 20A and FIG. 20B, the amount of the divalent cations is almost constant everywhere in the direction of the film thickness, but contrary to this, the amount of the tetravalent cations simply and almost linearly increases from the surface A to the surface B.

The crucible and other tools such as substrate fixer used in film formation partly dissolve out into the film-forming flux in the crucible, and the amount of the thus-dissolved element gradually increases in the flux during the epitaxial growth of film. In that condition, if the dissolved element is taken in the Bi-substituted rare earth-iron-garnet single crystal formed, the amount of the element shall gradually increase in the garnet single-crystal film that grows in a mode of epitaxial growth. As a result, when the element having dissolved in flux becomes divalent or tetravalent cations in the garnet single-crystal film formed, then the resulting cations are unevenly distributed in the direction of the film growth and will therefore break the charge balance of the garnet single-crystal film.

By controlling the amount of the divalent and tetravalent cations that enter the Bi-substituted rare earth-iron-garnet single-crystal film from the starting material thereof as well as the amount of the divalent and tetravalent cations that gradually dissolve into flux during the film growth and enter the garnet single-crystal film formed, it will be possible to make the film keep its charge balance in a specific site in the direction of the film thickness of the Faraday rotator formed of the film. However, the composition of the element that dissolves in flux during the epitaxial film growth to be divalent and tetravalent cations therein fluctuates in the direction of the film growth. Therefore, even though the film formed could have its charge balance in some part, it may not have it in the other part. In the part thereof where the film could not have its charge balance, optical loss will be inevitable. For example, in the case of FIG. 20A and FIG. 20B, the amount of the divalent cations and that of the tetravalent cations are both d at the site C that is nearly the center between the surfaces A and B, and they are equal. However, the amount of the tetravalent cations increases in the direction of the film growth, and therefore it is smaller than the amount, d, of the divalent cations in the site nearer to the surface A than the site C, while it is larger than the amount, d, of the divalent cations in the site nearer to the surface B than the site C. Accordingly, except at the site C, the amount of the divalent cations is not equal to that of the tetravalent cations, and the film loses its charge balance. As a result, insertion loss will be inevitable in Faraday rotators formed of the film.

Given that situation, when the elements that may be divalent and tetravalent cations in Bi-substituted rare earth-iron-garnet single-crystal film are uniformly distributed in the direction of the film growth and when the film is specifically so designed that it may keep the charge balance between the divalent and tetravalent cations therein, then the insertion loss in the Faraday rotators formed of the film, which may be caused by charge unbalance in the film, could be reduced. Uniform composition distribution of divalent and tetravalent cations in the film is the most effective for optical loss reduction, but even if the composition distribution is not uniform, the insertion loss in the Faraday rotators formed of the film may be significantly reduced as compared with that in conventional Faraday rotators so far as the composition distribution fluctuation in the film is limited to a predetermined range.

One typical element that dissolves into flux from crucibles and other tools during film growth is Pt. Pt hardly dissolves in flux of PbO, $Bi_2O_3$ and $B_2O_3$ that serve as solvent, and, in addition, it is a high-melting-point material (having a melting point of 1772° C.). Therefore, Pt is generally used for the constitutive element of crucibles and substrate fixers in LPE. Pt is hardly soluble in solvent but dissolves a little therein. Therefore, it will gradually dissolve in the flux during epitaxial film growth. Thus dissolved, Pt forms stable tetravalent cations and enters into the garnet single crystal formed, and, as a result, it varies the composition of the growing film. Accordingly, the garnet single-crystal film formed shall contain both $Pb^{2+}$ having a uniform composition distribution and $Pt^{4+}$ having a non-uniform composition distribution. For these reasons, the insertion loss in the Faraday rotators formed of the film could not be almost 0.

For reducing the insertion loss in Faraday rotators, we, the present inventors have tried Au for crucibles, flux stirrers and substrate fixers that are used for film growth, and have investigated film formation through epitaxial growth. Au is an element that is extremely hardly oxidized, and therefore, when it is used as a material for forming crucibles and other tools for film formation, it dissolves little in flux and deposits little in the garnet single-crystal film formed. In addition, Au is stable when it is a trivalent cation. Therefore, even though having entered the garnet single-crystal film, it does not break the charge balance of the film. Accordingly, when Au is used as the constitutive material of crucibles and other tools for film formation for the purpose of producing an epitaxial film with a charge balance between Pb to form divalent cations and other elements such as Si, Ge and Ti to form tetravalent cations and when Faraday rotators are formed of the thus-produced epitaxial film, then the insertion loss in the resulting Faraday rotators could be almost 0.

However, the melting point of Au is 1064° C. and is near to the film-growing temperature of from 800 to 900° C. Therefore, the strength of crucibles and tools formed of Au is not satisfactory. To solve the problem of strength insufficiency, alloys of Pt and Au are used for crucibles and other tools for film formation. The amount of Pt to be released into flux from crucibles and tools formed of Pt—Au alloy during film formation is smaller than that from crucibles and tools formed of Pt alone.

Using crucibles and tools formed of Pt—Au alloy, a Bi-substituted rare earth-iron-garnet single-crystal film was formed, in which the composition of $Pt^{4+}$ fluctuated a little. The garnet single-crystal film was worked and coated with an antireflection film to give a Faraday rotator. The two surfaces of the garnet single-crystal film through which light enters and goes out the rotator were analyzed for the Pt composition therein and compared with each other. The data were analyzed in point of the relation to the insertion loss in the rotator. As a result, it has been confirmed that, when the composition distribution satisfies the condition that the amount of Pt in one surface is equal to or is two times or less that of Pt in the other surface, then the insertion loss in the Faraday rotator is significantly lower than that in conventional Faraday rotators. On the other hand, using crucibles and tools formed of Au, also formed was a Bi-substituted rare earth-iron-garnet single-crystal film not containing Pt at all. The film was worked into a Faraday rotator. The insertion loss in this Faraday rotator was almost 0.

Pt is stable when it is a tetravalent cation. Other elements such as Si, Ge and Ti that are stable when they are tetravalent cations like Pt are described. So far as the element composition distribution satisfies the condition that the composition in one surface of Faraday rotator is equal to or is two times or less that of the composition in the other surface thereof, the insertion loss in the Faraday rotator can be reduced. The essential cations in Bi-substituted rare earth-iron-garnet single-crystal film are trivalent and tetravalent cations, and the valence difference between them is only 1. To that effect, the valence difference between divalent cations and trivalent cations is also only 1. Accordingly, the same as above shall apply also to the elements that are stable when they are divalent cations. Concretely, so far as the composition distribution of the elements to be stable divalent cations satisfies the condition as above, then insertion loss in the Faraday rotators formed of the film may also be reduced. The elements that enter garnet single-crystal film through epitaxial growth thereof and form stable divalent cations therein are, for example, Pb, Ca, Cd and Mg. When crucibles and tools that contain any of these elements except Pt capable of forming stable divalent or tetravalent cations are used in producing garnet single-crystal film, these elements will dissolve in flux and will enter the garnet single crystal formed. Even so, the insertion loss in Faraday rotators formed of the film may be reduced so far as the element composition fluctuation in the film is controlled to fall within the predetermined range.

In film growth in air, Pb changes into $Pb^{2+}$ and enters the garnet single crystal formed. However, Pb may form $Pb^{4+}$ through atmosphere control and heat treatment to keep the charge balance of the film formed, and the insertion loss through Faraday rotator formed of the film in that condition can be reduced. In this case, Pb forms divalent and tetravalent cations in a specific ratio and the thus-formed cations have their own composition distribution. Accordingly, so far as the cations satisfy the condition that the amount of Pb in one surface of the film is equal to or is two times or less that of Pb in the other surface thereof, the insertion loss in the Faraday rotator formed of the film may be reduced irrespective of the presence or absence of heat treatment of the film.

As described herein above, the Faraday rotator of this embodiment comprises a Bi-substituted rare earth-iron-garnet single-crystal film having a chemical formula:

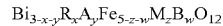

$$Bi_{3-x-y}R_xA_yFe_{5-z-w}M_zB_wO_{12}$$

wherein R is at least one element selected from rare earth elements including Y; A is at least one element selected from Pb, Ca and Cd; x and y satisfy $1.5 < x+y < 2.5$; M is at least one element selected from Ga, Al, Sc and In; B is at least one element selected from Si, Ti, Ge, Pt and Mg; and z and w satisfy $0 \leq z+w < 1.5$.

The Faraday rotator of this embodiment comprises the Bi-substituted rare earth-iron-garnet single-crystal film and two surfaces formed on the single-crystal film for light transmission through them, and, when y in one of the two surfaces is represented by $y_1$ and y in the other is represented by $y_2$, then $y_1$ and $y_2$ satisfy $y_2 \leq y_1 \leq 2y_2$; and when w in one of the two surfaces is represented by $w_1$ and w in the other is represented by $w_2$, then $w_1$ and $w_2$ satisfy $w_2 \leq w_1 \leq 2w_2$. Preferably, $y_1$ and $y_2$ satisfy $y_1 \approx y_2$, and $w_1$ and $w_2$ satisfy $w_1 \approx w_2$.

Figure 21A:
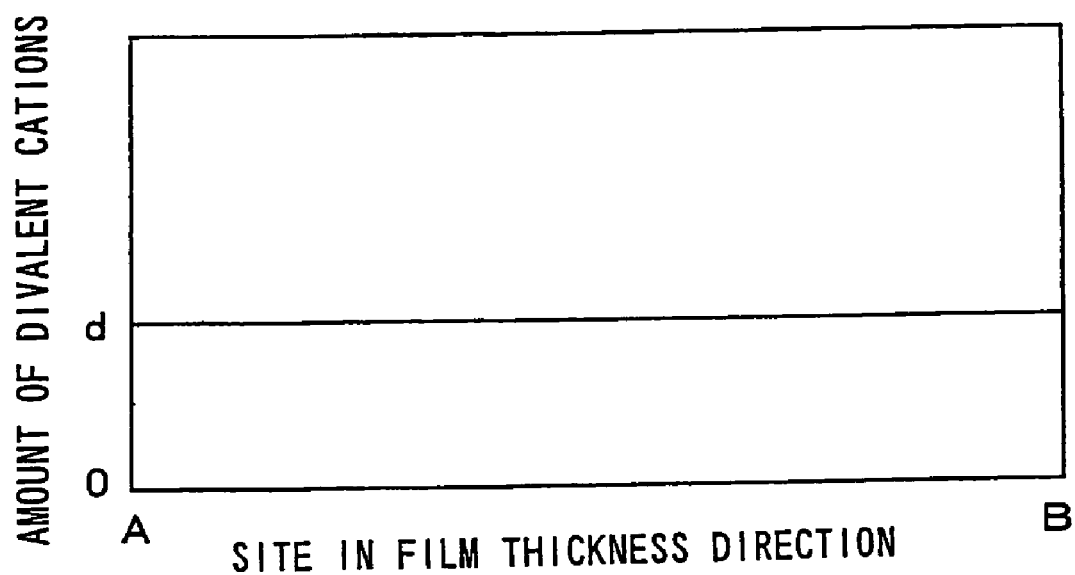
FIG. 21A and FIG. 21B are graphs each showing the distribution of the amount of divalent or tetravalent cations in the direction of the thickness of a Bi-substituted rare earth-iron-garnet single-crystal film for Faraday rotators of the fourth embodiment of the invention.
Figure 21B:
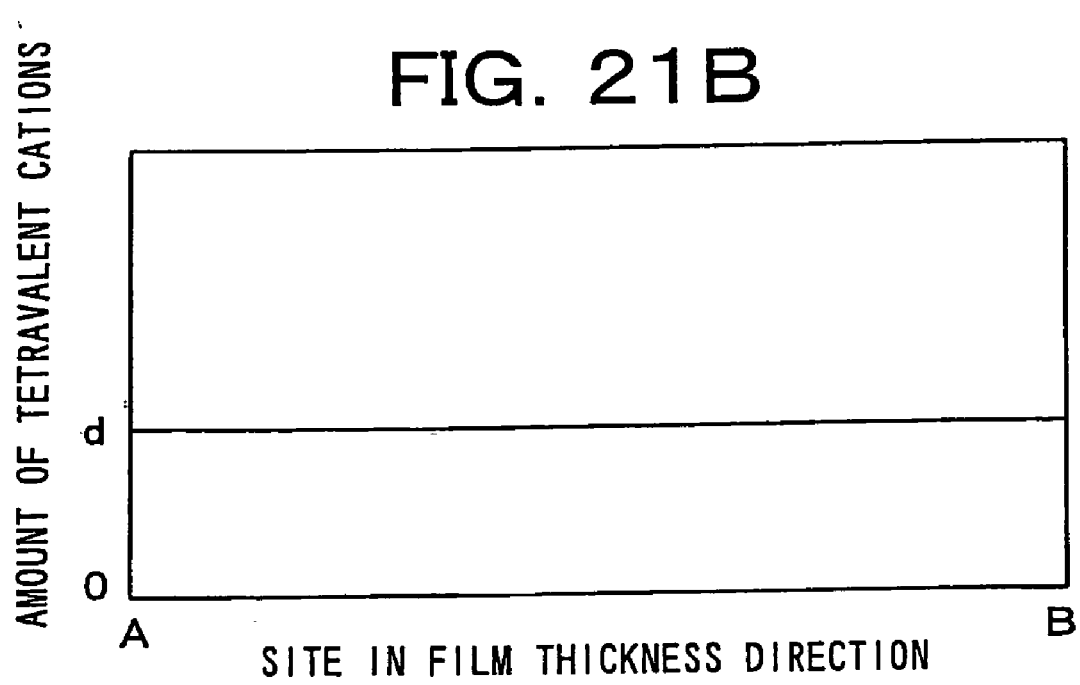

FIG. 21A shows the distribution of the amount of divalent cations in the direction of the thickness of a garnet single-crystal film for the Faraday rotator of this embodiment, and this is a graph corresponding to the graph of FIG. 20A. FIG. 21B shows the distribution of the amount of tetravalent cations in the direction of the thickness of a garnet single-crystal film for the Faraday rotator of this embodiment, and this is a graph corresponding to the graph of FIG. 20B. As in FIG. 21A and FIG. 21B, both the amount of divalent cations and that of tetravalent cations are almost constant everywhere in the direction of the film thickness. Accordingly, in this embodiment, the amount of divalent and tetravalent cations to be released from the starting material into the garnet single-crystal film formed can be controlled to be the same level of d anytime during the film formation, and the Faraday rotator formed of the film ensures its charge balance everywhere in the direction of the film thickness.

As described herein above, the insertion loss in the Faraday rotator formed of the Bi-substituted rare earth-iron-garnet single-crystal film of this embodiment can be significantly reduced, when the fluctuation in the composition distribution of the elements that form stable divalent or tetravalent cations in the garnet single-crystal film in the direction in which the film receives and emits light is controlled to fall within a predetermined range. As in FIG. 4 to FIG. 6 already described herein above, the Faraday rotator of this embodiment is usable in optical devices and optical communication systems.

The Faraday rotator of this embodiment is described with reference to the following concrete Examples.

EXAMPLE 4-1

$Gd_2O_3$, $Yb_2O_3$, $Bi_2O$, $Fe_2O_3$, $Ga_2O_3$, $GeO_2$, PbO and $B_2O_3$ were put into an Au crucible, and melted and stirred therein. A CaMgZr-substituted gadolinium-gallium-garnet single-crystal substrate was fixed with an Au fixer, and a Bi-substituted rare earth-iron-garnet single-crystal film having a composition of $(BiGdYbPb)_3(FeGaGe)_5O_{12}$ was grown from the melt on the substrate through LPE. This garnet single-crystal film was polished and cut, and its two light-transmitting surfaces were coated with an antireflection film. This gave a Faraday rotator having a size of 1.5 mm×1.5 mm and a thickness of 360 μm and having a Faraday rotation angle of 45 degrees at a wavelength of 1.55 μm. This Faraday rotator was analyzed for the garnet composition. The composition analysis was effected for Pb and Ge through laser ablation/ICP mass spectrometry of the two surfaces of the garnet single-crystal film. The analyzed data were relatively compared with each other, and the compositional ratio of the constitutive elements in the two surfaces was determined. As a result, the compositional ratio of the constitutive elements in the two surfaces of the Faraday rotator was as follows: Based on the standardized amount, 100, of Pb and Ge in one surface of the rotator, the relative amount of Pb and Ge in the other surface thereof was 110 each. In addition, the insertion loss in the Faraday rotator was measured with light having a wavelength of 1.55 μm, and it was 0 dB.

EXAMPLE 4-2

$Gd_2O_3$, $Yb_2O_3$, $Bi_2O$, $Fe_2O_3$, $Ga_2O_3$, $GeO_2$, PbO and $B_2O_3$ were put into an Au crucible, and melted and stirred therein. A CaMgZr-substituted gadolinium-gallium-garnet single-crystal substrate was fixed with a Pt fixer, and a Bi-substituted rare earth-iron-garnet single-crystal film having a composition of $(BiGdYbPb)_3(FeGaGePt)_5O_{12}$ was grown from the melt on the substrate through LPE. This garnet single-crystal film was polished and cut, and its two light-transmitting surfaces were coated with an antireflection film. This gave a Faraday rotator having a size of 1.5 mm×1.5 mm and a thickness of 360 μm and having a Faraday rotation angle of 45 degrees at a wavelength of 1.55 μm. This Faraday rotator was analyzed for the garnet composition. The composition analysis was effected for Pb, Ge and Pt through laser ablation/ICP mass spectrometry of the two surfaces of the garnet single-crystal film. The analyzed data were relatively compared with each other, and the compositional ratio of the constitutive elements in the two surfaces was determined. As a result, the compositional ratio of the constitutive elements in the two surfaces of the Faraday rotator was as follows: Based on the standardized amount, 100, of Pb, Ge and Pt in one surface of the rotator, the relative amount of Pb in the other surface thereof was 90, that of Ge was 100, and that of Pt was 150. In addition, the insertion loss in the Faraday rotator was measured with light having a wavelength of 1.55 μm, and it was 0.01 dB.

EXAMPLE 4-3

$Gd_2O_3$, $Yb_2O_3$, $Bi_2O$, $Fe_2O_3$, $Ga_2O_3$, $GeO_2$, PbO and $B_2O_3$ were put into a crucible of Au—Pt alloy, and melted and stirred therein. A CaMgZr-substituted gadolinium-gallium-garnet single-crystal substrate was fixed with a Pt fixer, and a Bi-substituted rare earth-iron-garnet single-crystal film having a composition of $(BiGdYbPb)_3(FeGaGePt)_5O_{12}$ was grown from the melt on the substrate through LPE. This garnet single-crystal film was polished and cut, and its two light-transmitting surfaces were coated with an antireflection film. This gave a Faraday rotator having a size of 1.5 mm×1.5 mm and a thickness of 360 μm and having a Faraday rotation angle of 45 degrees at a wavelength of 1.55 μm. This Faraday rotator was analyzed for the garnet composition. The composition analysis was effected for Pb, Ge and Pt through laser ablation/ICP mass spectrometry of the two surfaces of the garnet single-crystal film. The analyzed data were relatively compared with each other, and the compositional ratio of the constitutive elements in the two surfaces of the Faraday rotator was as follows: Based on the standardized amount, 100, of Pb, Ge and Pt in one surface of the rotator, the relative amount of Pb in the other surface thereof was 90, that of Ge was 100, and that of Pt was 200. In addition, the insertion loss in the Faraday rotator was measured with light having a wavelength of 1.55 μm, and it was 0.03 dB.

COMPARATIVE EXAMPLE 4-1

$Gd_2O_3$, $Yb_2O_3$, $Bi_2O$, $Fe_2O_3$, $Ga_2O_3$, $GeO_2$, PbO and $B_2O_3$ were put into a Pt crucible, and melted and stirred therein. A CaMgZr-substituted gadolinium-gallium-garnet single-crystal substrate was fixed with a Pt fixer, and a garnet single-crystal film having a composition of $(BiGdYbPb)_3(FeGaGePt)_5O_{12}$ was grown from the melt on the substrate through LPE. This garnet single-crystal film was polished and cut, and its two light-transmitting surfaces were coated with an antireflection film. This gave a Faraday rotator having a size of 1.5 mm×1.5 mm and a thickness of 360 μm and having a Faraday rotation angle of 45 degrees at a wavelength of 1.55 μm. This Faraday rotator was analyzed for the garnet composition. The composition analysis was effected for Pb, Ge and Pt through laser ablation/ICP mass spectrometry of the two surfaces of the garnet single-crystal film. The analyzed data were relatively compared with each other, and the compositional ratio of the constitutive elements in the two surfaces was determined. As a result, the compositional ratio of the constitutive elements in the two surfaces of the Faraday rotator was as follows: Based on the standardized amount, 100, of Pb, Ge and Pt in one surface of the rotator, the relative amount of Pb in the other surface thereof was 90, that of Ge was 90, and that of Pt was 250. In addition, the insertion loss in the Faraday rotator was measured with light having a wavelength of 1.55 μm, and it was 0.05 dB.

As in the above, this embodiment provides a Faraday rotator formed of a Bi-substituted rare earth-iron-garnet single-crystal film, in which the composition fluctuation of the elements that are stable as divalent and tetravalent cations, in the light-transmitting direction of the film is controlled to fall within a predetermined range. The insertion loss in the Faraday rotator of this embodiment is significantly reduced.

In addition, in the Faraday rotator formed of a Bi-substituted rare earth-iron-garnet single-crystal film of this embodiment, the composition distribution of the elements that are stable as divalent and tetravalent cations is unified in the light-transmitting direction of the film, and the insertion loss in the Faraday rotator of this type can be substantially 0.

As described herein above, this embodiment realizes a Faraday rotator in which the insertion loss is reduced, and realizes an optical device that comprises it.

As in the above, the present invention realizes a magnetic garnet material, a Faraday rotator, an optical device and a bismuth-substituted rare earth-iron-garnet single-crystal film that have the advantages of reduced insertion loss and improved magnetic properties, and realizes a method for producing the film and a crucible for its production.

What is claimed is:

1. A method for producing a bismuth-substituted rare earth-iron-garnet single-crystal film in a mode of liquid-phase epitaxial growth, which comprises:
   a step of putting a starting material composition for the bismuth-substituted rare earth-iron-garnet single-crystal film, Au and a flux composition into a crucible;
   a step of heating and melting the starting material composition and Au to be a melt;
   a step of cooling the melt to a temperature at which the bismuth-substituted rare earth-iron-garnet single-crystal film grows; and a step of contacting the thus-cooled melt with a single-crystal film-growing substrate to thereby make the intended bismuth-substituted rare earth-iron-garnet single-crystal film grow on the substrate.

2. A method for producing a bismuth-substituted rare earth-iron-garnet single-crystal film in a mode of liquid-phase epitaxial growth, which comprises:

a step of putting a starting material composition for the bismuth-substituted rare earth-iron-garnet single crystal film and a flux composition into a crucible that contains Au at least in the site thereof to be kept in contact with a melt therein:

a step of heating and melting the starting material composition to be a melt:

a step of cooling the melt to a temperature at which the bismuth-substituted rare earth-iron-garnet single crystal film grows; and a step of contacting the thus cooled melt with a single-crystal film-growing substrate to thereby make the intended bismuth-substituted rare earth-iron-garnet single crystal film grow on the substrate, for which a non-lead flux composition is used for liquid-phase epitaxial growth so as to prevent the film from being contaminated with impurities from flux.

3. A method for producing a bismuth-substituted rare earth-iron-garnet single-crystal film in a mode of liquid-phase epitaxial growth, which comprises:

a step of putting a starting material composition for the bismuth-substituted rare earth-iron-garnet single crystal film and a flux composition into a crucible that contains Au at least in the site thereof to be kept in contact with a melt therein:

a step of heating and melting the starting material composition to be a melt:

a step of cooling the melt to a temperature at which the bismuth-substituted rare earth-iron-garnet single crystal film grows; and a step of contacting the thus cooled melt with a single-crystal film-growing substrate to thereby make the intended bismuth-substituted rare earth-iron-garnet single crystal film grow on the substrate, for which a non-lead flux composition is used for liquid-phase epitaxial growth so as to prevent the film from being contaminated with impurities from flux.

* * * * *